(12) United States Patent
Jansson et al.

(10) Patent No.: US 12,456,984 B2
(45) Date of Patent: Oct. 28, 2025

(54) PVT STABILIZATION OF PIPELINED SAR ADC

(71) Applicant: Telefonaktiebolaget LM Ericsson (publ), Stockholm (SE)

(72) Inventors: Christer Jansson, Linköping (SE); Mattias Palm, Bara (SE)

(73) Assignee: TELEFONAKTIEBOLAGET LM ERICSSON (PUBL), Stockholm (SE)

( * ) Notice: Subject to any disclaimer, the term of this patent is extended or adjusted under 35 U.S.C. 154(b) by 213 days.

(21) Appl. No.: 18/038,675

(22) PCT Filed: Dec. 3, 2020

(86) PCT No.: PCT/EP2020/084556
§ 371 (c)(1),
(2) Date: May 24, 2023

(87) PCT Pub. No.: WO2022/117200
PCT Pub. Date: Jun. 9, 2022

(65) Prior Publication Data
US 2023/0421164 A1 Dec. 28, 2023

(51) Int. Cl.
*H03M 1/06* (2006.01)
*H04B 1/40* (2015.01)

(52) U.S. Cl.
CPC ............ *H03M 1/0604* (2013.01); *H04B 1/40* (2013.01)

(58) Field of Classification Search
CPC ......... H03M 1/40; H03M 1/064; H03M 1/168
See application file for complete search history.

(56) References Cited

U.S. PATENT DOCUMENTS 9,819,314 B1 * 11/2017 Chiu .................... H03F 3/45188
10,461,725 B2 * 10/2019 Cho ...................... H03K 5/2481
(Continued)

OTHER PUBLICATIONS

Wang, R. et al., "A Low Power Temperature-Compensated Common-Mode Voltage Detector for Dynamic Amplifiers", 2020 IEEE International Symposium on Circuits and Systems, Sep. 28, 2020, pp. 1-4, IEEE.

(Continued)

*Primary Examiner* — Lam T Mai
(74) *Attorney, Agent, or Firm* — COATS & BENNETT, PLLC

(57) ABSTRACT

In a pipelined Successive Approximation Register Analog to Digital Converter, SAR ADC, a Process, Temperature, and Voltage (PVT)-dependent bias voltage is generated and used to bias the inputs of comparators in at least the first SAR stage and residual amplifier (RA). This achieves a stable biasing and an operating point of the comparators and RA input stages that is independent of PVT variations, by tracking PVT variations in such a way that variations in MOS threshold voltage and drain-source voltage are counteracted. Additionally, a threshold common mode voltage is generated from the PVT-dependent voltage, which controls the amplification duration of the RAs such that the final RA output common mode voltage is substantially equal to the PVT-dependent voltage, which is used to bias the inputs of successive SAR stages. The threshold is set to account for logic delays in terminating the amplification based on the threshold comparison, to achieve the desired common mode amplifier output. The dependency on PVT of the threshold additionally cancels temperature variation from a differential stage transconductance of the RA. Further temperature stabilization is achieved by boosting the charge output by the RA to a capacitive load during part of the amplification.

34 Claims, 17 Drawing Sheets

(56) References Cited

U.S. PATENT DOCUMENTS

| | | | | |
|---|---|---|---|---|
| 11,152,949 B2* | 10/2021 | Spagnolo | .............. | H03M 1/804 |
| 11,750,160 B1* | 9/2023 | Lok | ....................... | H03M 1/164 |
| | | | | 330/295 |
| 2010/0156692 A1* | 6/2010 | Jeon | ..................... | H03M 1/164 |
| | | | | 341/162 |
| 2022/0190840 A1* | 6/2022 | Moon | ................... | H03M 1/462 |

OTHER PUBLICATIONS

Huang, H. et al., "A Non-Interleaved 12-b 330-MS/s Pipelined-SAR ADC With PVT-Stabilized Dynamic Amplifier Achieving Sub-1-dB SNDR Variation", IEEE Journal of Solid-State Circuits, vol. 52 No. 12, Dec. 2017, pp. 3235-3247, IEEE.

Huang, H. et al., "A 12b 330MS/s Pipelined-SAR ADC with PVT-Stabilized Dynamic Amplifier Achieving <1dB SNDR Variation", 2017 IEEE International Solid-State Circuits Conference (ISSCC), Feb. 5-9, 2017, pp. 471-473, EEE.

Zhang, M., et al., "A Temperature Compensation Technique for a Dynamic Amplifier in Pipelined-SAR ADCs", IEEE Solid-State Circuits Letters, vol. 1 No. 1, Jan. 2018, pp. 10-14, IEEE.

* cited by examiner

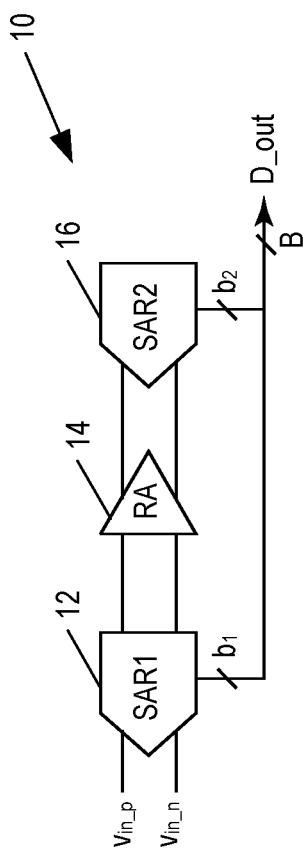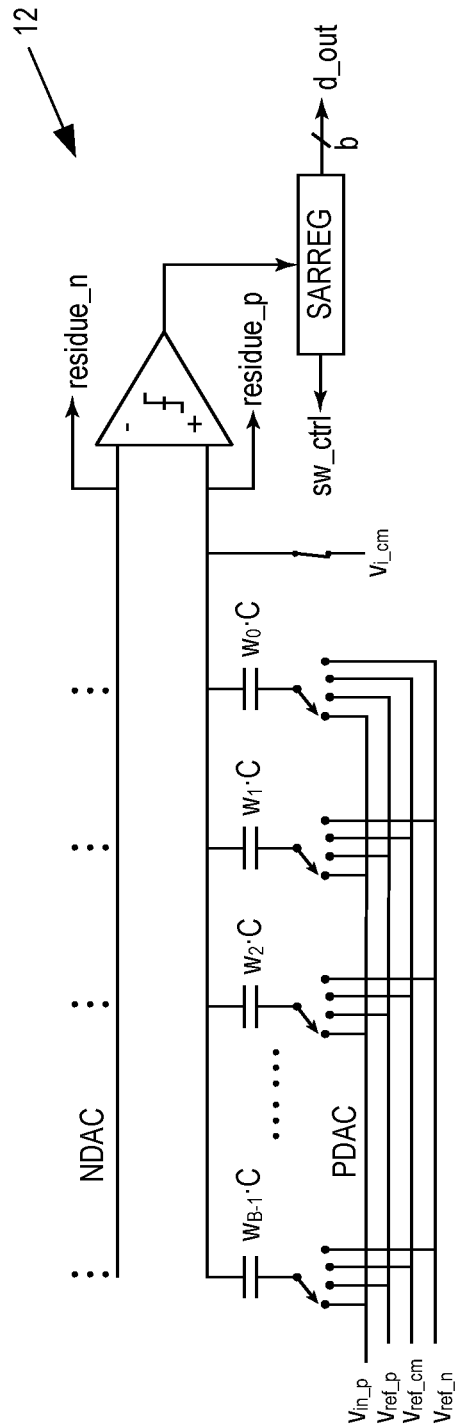
*FIG. 1 PRIOR ART*
*FIG. 2*

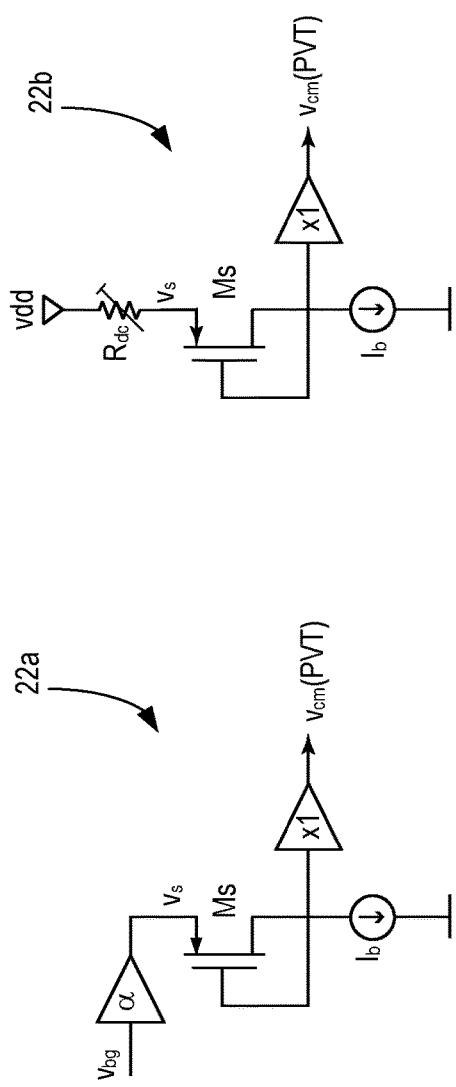
*FIG. 11A*
*FIG. 11B*
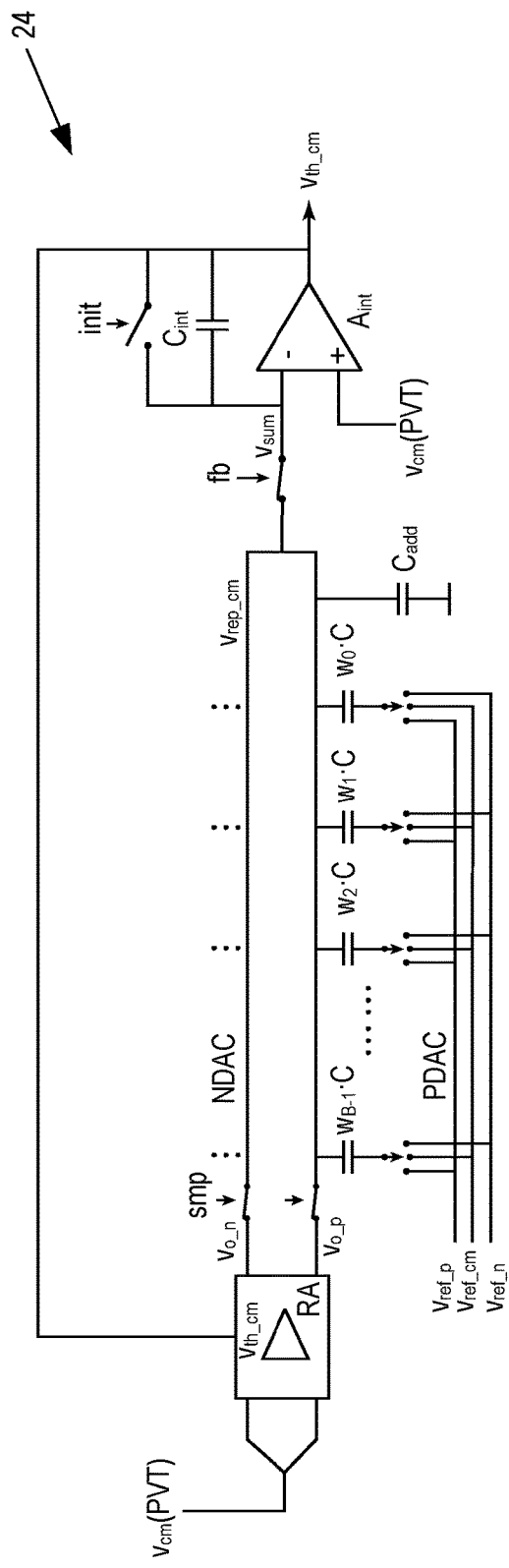
*FIG. 12*

PVT STABILIZATION OF PIPELINED SAR ADC

TECHNICAL FIELD

The present invention relates generally to Analog to Digital Conversion, and in particular to a pipeline Successive Approximation Register ADC that is stabilized with respect to variations in Process, Voltage, and Temperature.

BACKGROUND

The conversion of information between analog and digital domains is a routine part of many electronic devices. For example, wireless communication networks propagate analog Radio Frequency (RF) carrier signals across an air interface between access nodes and mobile terminals; the carrier signals are modulated with information representing voice and data. At both the access nodes and mobile terminals, the received analog RF signals must be converted to digital data for processing by digital processing circuits, such as Digital Signal Processors (DSPs). Of course, information must also be converted from the digital to the analog domain for transmission. Ideally, analog/digital conversion should be performed at high speed, with high accuracy over variations in semiconductor process, supply voltage, and temperature, and by using small circuits that consume little silicon footprint and dissipate little power.

One known type of Analog-to-Digital Converter (ADC) that features low power consumption and a small form factor, at moderate speeds, is a Successive Approximation Register (SAR) type. A SAR ADC iteratively resolves a sampled voltage one or more bits at a time, from most significant (MSB) to least (LSB).

FIG. 1 depicts a pipeline SAR ADC structure 10 comprising two SAR ADC stages. The first SAR stage 12 (SAR1) is a bottom-plate sampling SAR ADC stage, and the second SAR stage 16 (SAR2) is a top-plate sampling SAR ADC stage, as described in greater detail herein. The residual voltage of the first SAR stage 16 is amplified by the residual amplifier (RA) 14, and is then sampled by the second SAR stage 16. Of course, the pipeline SAR ADC 10 may extend to more than two SAR stages 12, 16. Pipelining reduces the number of bits that must be resolved at each stage. Reducing the number of bits per stage can reduce the complexity and component count of the ADC 10, and increase the sampling speed.

The RA(s) in a pipeline SAR ADC may be implemented with static amplifiers, which have relatively well-defined and stable gain, set by ratios of devices in the feedback path. However, static amplifiers typically include operational amplifiers, which become very power hungry when designed to settle at high speed. Static amplifiers also require a time constant much shorter than the time for amplification to achieve enough settling, implying a high noise bandwidth and therefore large noise.

Dynamic amplifiers (and comparators) are often used for RAs in modern pipeline SAR ADCs due to their higher power efficiency. However, dynamic amplifiers lack the gain stability of static amplifiers, making them sensitive to Process, Voltage, and Temperature (PVT) variations. Some variation in RA gain can be tolerated by using redundancy and digital error correction. However, redundancy has costs, and digital correction is relatively slow to track changes in gain. In mobile communication network applications, ambient temperature can vary significantly, which may cause larger variations in gain and hence requires larger redundancy with its costs. Furthermore, many circuits, such as power amplifiers in both base stations and mobile devices, generate significant heat. To reduce the environmental impact of operating such circuits, reduce the cost of heat dissipation equipment, and to prolong battery life of mobile devices, it is advantageous to reduce power consumption. One known approach is place circuits in inactive, or "sleep" mode when they are not being used. When these circuits are activated, they and their surroundings may experience a rapid and dramatic rise in temperature—too fast for digital correction to compensate. Accordingly, analog compensation of PVT variation in pipeline SAR ADCs is beneficial, and two approaches are known in the art.

A first known PVT compensation method creates an amplification enable control signal from a RA replica having a known input signal. The control signal is enabled to start the replica amplification, and when the RA replica has amplified its input by the desired amount, the control signal is disabled. This control signal is then applied to an RA in the ADC to control the amplification time and thereby provide the desired gain. See Huang, et al., "A 12b 330 MS/s Pipelined-SAR ADC with PVT-Stabilized Dynamic Amplifier Achieving <1 dB SNDR Variation," published in the 2017 IEEE International Solid-State Circuits Conference (ISSCC), and also U.S. Pat. No. 9,819,314 to Chiu, et al., the disclosures of both of which are incorporated herein by reference in their entireties.

A second known PVT compensation method utilizes a common mode voltage detector, and terminates the amplification of an RA when its output common mode voltage has reached a certain threshold level. This threshold level is generated such that it counteracts the temperature dependency of the RA input stage transconductance. This technique utilizes the MOS transistor threshold temperature dependency to generate an adequate common mode threshold. See Zhang, et al., "A Temperature Compensation Technique for a Dynamic Amplifier in Pipelined-SAR ADCs," published in the IEEE Solid-State Circuits Letters, vol. 1, no. 1, January 2018, the disclosures of which is incorporated herein by reference in its entirety.

The power supply voltage of modern processes is in the sub-volt range, and leaves small headroom margins in analog circuits such as amplifiers and comparators, making them ever more vulnerable to PVT variations. The prior art methods cited above for stabilizing RA gain over PVT do not address the challenges with small voltage headroom, which make it difficult to design the circuits to always have a favorable operating point. Consequently, substantial changes in the circuits' offsets, linearity, and speed may be encountered as the temperature shifts.

For example, none of the methods cited above address the common mode voltage level at the input of comparators and RA of the first pipeline stage. At low temperatures and/or slow process corners, the MOS threshold voltage increases. As a consequence, the transistor acting as a current source in the RA will have insufficient headroom, causing the current in the RA and comparator input stage eventually to pinch off, severely affecting the circuit operation. At high temperatures and/or fast process corners, the MOS threshold voltage decreases and the RA input stage will eventually go out of saturation at high RA output swing. In this case, ADC conversion speed will suffer, and RA gain and linearity will be undesirably modulated when its input stage transconductance and output impedance vary over PVT variations.

The first prior art method described above offers no direct control of the RA output common mode voltage, since it only stabilizes the RA gain to a certain value. Therefore, succeeding ADC stages may suffer due to the major uncertainty of their input common mode voltages. The second prior art method described above uses a common mode voltage detector to turn off the RA at a PVT-controlled threshold, but it does not compensate for the delay in the RA's common mode voltage detector, from the moment that the common mode level reaches the threshold until a control signal turns off the amplification. For a fast RA, the output common mode voltage level changes quickly with a high derivative, which makes the circuit sensitive to this delay, which is also PVT dependent. The inaccurate delay will cause the overall gain stabilization to become less efficient, and also cause the common mode voltage level to the succeeding stages to vary in an undesired fashion.

The Background section of this document is provided to place embodiments of the present invention in technological and operational context, to assist those of skill in the art in understanding their scope and utility. Approaches described in the Background section could be pursued, but are not necessarily approaches that have been previously conceived or pursued. Unless explicitly identified as such, no statement herein is admitted to be prior art merely by its inclusion in the Background section.

SUMMARY

The following presents a simplified summary of the disclosure in order to provide a basic understanding to those of skill in the art. This summary is not an extensive overview of the disclosure and is not intended to identify key/critical elements of embodiments of the invention or to delineate the scope of the invention. The sole purpose of this summary is to present some concepts disclosed herein in a simplified form as a prelude to the more detailed description that is presented later.

According to embodiments of the present invention disclosed and claimed herein, a PVT-dependent bias voltage is generated and used to bias the inputs of comparators in at least the first SAR stage and RA of a pipeline SAR ADC (the comparator and RA input stages must use MOS transistors of the same type—either NMOS or PMOS). This maintains the operating point of the comparators and RA input stages fixed. The PVT-dependent bias voltage tracks PVT variations in such a way that variations in MOS threshold voltage and drain-source voltage are counteracted.

In another embodiment, the PVT-dependent voltage is used to generate a threshold voltage for regulating the output common mode voltage and terminating amplification of the RA. The threshold is set such that the CM output voltage of the RA is substantially the same as the PVT-dependent bias voltage. Since the CM output of each RA bias the inputs of comparators in the succeeding SAR stage, the entire pipeline SAR ADC is compensated for PVT variation. The threshold voltage generator additionally accounts for delays in the RA CM detector, thus accurately regulating RA gain. Regulating the CM output of the RAs to the PVT-dependent voltage further counteracts the temperature dependency of RA gain, caused by the temperature-dependent transconductance of the RA input-stage, and hence further stabilizes the RA gain.

In some embodiments, initially or during the RA amplification phase, the RA output voltage is additionally trimmed to adjust the effective CM change at RA amplification, either to set the RA gain directly to a specific value, or for further temperature dependency cancelation. The trimming can be an instantaneous event, or can be applied over the duration of the RA amplification.

The stabilization of the RA gain using a PVT-dependent CM output will increase variations in the amplification time. In one embodiment this is counteracted by biasing the RA with a proper mixture of a stable current with a current that is proportional to the absolute temperature, to maintain and stabilize the amplification speed.

One embodiment relates to a pipeline Successive Approximation Register (SAR) Analog to Digital Converter (ADC) including at least two SAR stages and a residual amplifier (RA) between each two SAR stages. The pipeline SAR ADC includes a common mode (CM) voltage generator configured to generate a CM voltage $V_{CM}(PVT)$ that depends on Process, Temperature, and Voltage (PVT) characteristics of the pipeline SAR ADC. Inputs of comparators in at least the first SAR stage are biased by $V_{CM}(PVT)$, whereby at least the first SAR stage operating point is independent of PVT variations.

Some embodiments of this pipeline SAR ADC further include a threshold voltage generator configured to generate a threshold common mode voltage, $V_{th\_cm}$, from $V_{CM}(PVT)$. Each RA controls its duration of amplification by comparing its output common mode voltage to $V_{th\_cm}$. The value of $V_{th\_cm}$ is set such that the comparison and delays in control circuitry regulate the RA output common mode voltage to substantially equal $V_{CM}(PVT)$. In some embodiments, an adjustable delta voltage $v_{o\_\Delta}$ is instantaneously added to the RA output common mode voltage to counter a temperature-dependent gain change of the RA. In other embodiments, the adjustable delta voltage $v_{o\_\Delta}$ is added to the RA output common mode voltage over the duration of the RA amplification, to set the RA gain to a predetermined value.

Another embodiment relates to a method of operating a pipeline Successive Approximation Register (SAR) Analog to Digital Converter (ADC) including at least two SAR stages and a residual amplifier (RA) between each two SAR stages. A common mode (CM) voltage $V_{CM}(PVT)$ that depends on Process, Temperature, and Voltage (PVT) characteristics of the pipeline SAR ADC is generated. Inputs of comparators in at least the first SAR stage are biased by $V_{CM}(PVT)$, whereby at least the first SAR stage operating point is independent of PVT variations.

In some embodiments of this method, a threshold common mode voltage $V_{th\_cm}$ is generated from $V_{CM}(PVT)$. A duration of amplification by each RA is controlled by comparing the RA output common mode voltage to $V_{th\_cm}$. The value of $V_{th\_cm}$ is set such that the comparison and delays in control circuitry regulate the RA output common mode voltage to substantially equal $V_{CM}(PVT)$.

Yet another embodiment relates to a wireless device operative in a wireless communication network. The wireless device includes processing circuitry and communication circuitry operatively connected to the processing circuitry. The communication circuitry includes one or more Process, Temperature, and Voltage compensated Successive Approximation Register Analog to Digital Converters as described above.

Still another embodiment relates to a network node operative in a wireless communication network. The network node includes processing circuitry and communication circuitry operatively connected to the processing circuitry. The communication circuitry includes one or more Process, Temperature, and Voltage compensated pipeline Successive Approximation Register Analog to Digital Converters as described above.

BRIEF DESCRIPTION OF THE DRAWINGS

The present invention will now be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art. Like numbers refer to like elements throughout.

FIG. 1 is a block diagram of a pipeline SAR ADC.

FIG. 2 is a diagram of a pipeline SAR ADC stage using bottom-plate input sampling.

FIG. 11A is a schematic diagram of a CM voltage generator referencing a PVT-dependent voltage to ground.

FIG. 11B is a schematic diagram of a CM voltage generator referencing a PVT-dependent voltage to the supply voltage.

FIG. 12 is a block diagram of a threshold CM voltage generator according to one embodiment.

DETAILED DESCRIPTION

For simplicity and illustrative purposes, the present invention is described by referring mainly to an exemplary embodiment thereof. In the following description, numerous specific details are set forth in order to provide a thorough understanding of the present invention. However, it will be readily apparent to one of ordinary skill in the art that the present invention may be practiced without limitation to these specific details. In this description, well known methods and structures have not been described in detail so as not to unnecessarily obscure the present invention.

Figure 3:
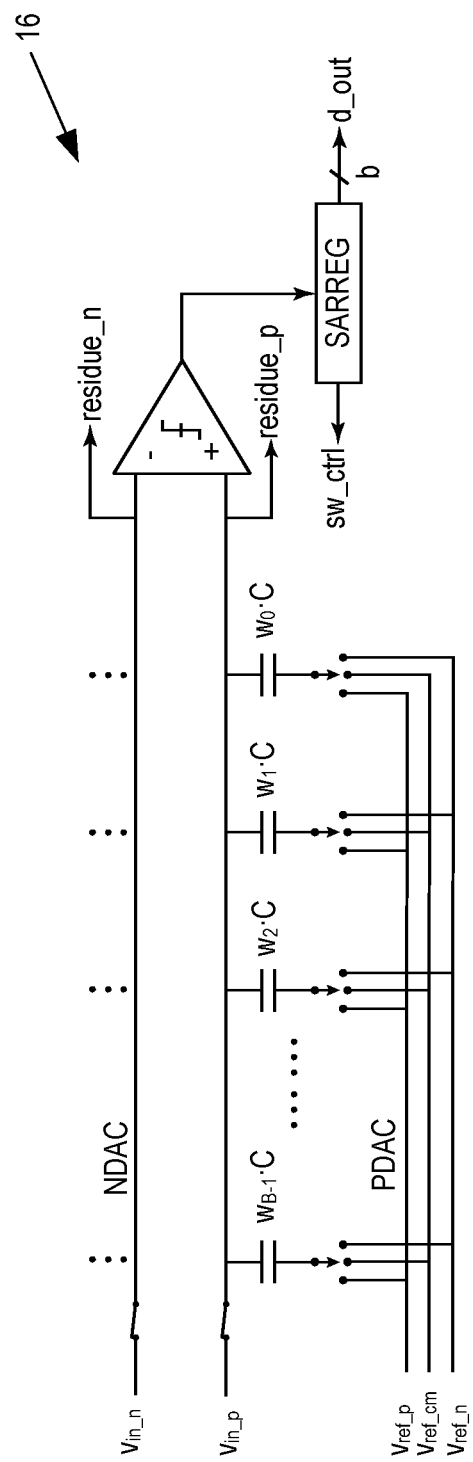
FIG. 3 is a diagram of a pipeline SAR ADC stage using top-plate input sampling.

FIG. 2 depicts the basic structure of a typical charge redistribution pipeline SAR ADC stage using bottom-plate input sampling, which may for example comprise the first SAR stage 12 of a pipeline SAR ADC. FIG. 3 depicts the same for a top-plate sampling SAR stage, which may be used for successive SAR stage(s) 14. For clarity, only the positive switched capacitor arrays (PDAC) are shown; it is understood that identical negative switched cap arrays (NDAC) are connected to the comparator negative inputs. Each pipeline SAR ADC stage 12, 16 includes a capacitive DAC, a comparator, and a register to control the switches in the DAC and store the digital output bits. The operation of such pipeline SAR ADCs is well known. After a completed conversion there will be an analog residual voltage left over the comparator inputs. In a pipeline structure, that residual voltage is amplified, sampled, and resolved by the next successive SAR stage.

For a SAR stage 12, 16 of b bits, the conversion time of one sample is typically b+1 clock cycles, including one clock cycle for sampling. When pipelining SAR stages 12, 16, some additional time for amplification of the residual voltage is needed. Considering the sampling rate, it is desired that the residual amplification can be completed within the time of one clock cycle. As discussed above, dynamic amplifiers are preferred over static amplifiers, as they are faster and much more power efficient. Dynamic amplifiers offer a near-optimal noise bandwidth in the given amplification time, since the output voltage is built up by integrating a steady current onto the load capacitance.

Figure 4:
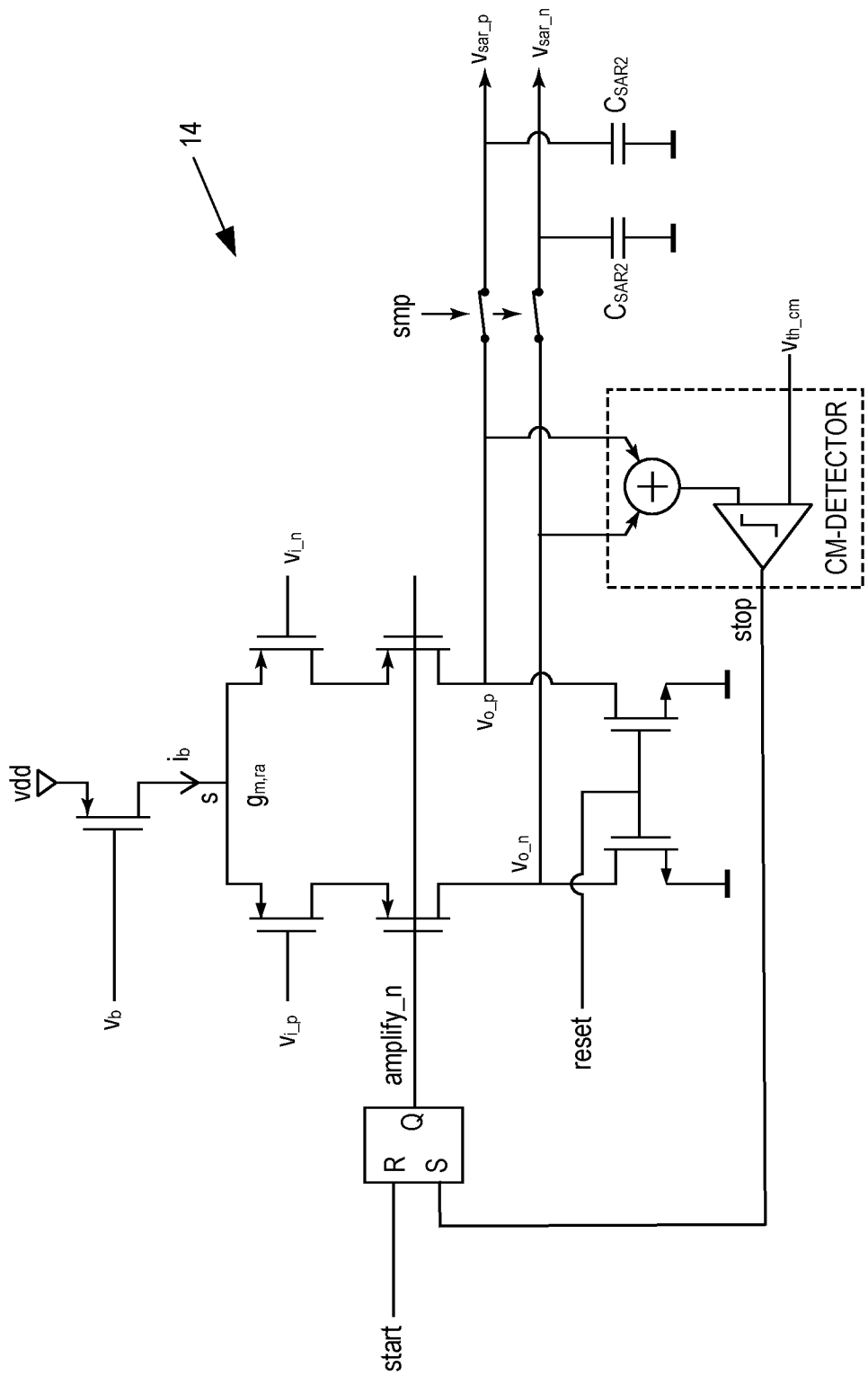
FIG. 4 is a schematic diagram of a dynamic, differential residual amplifier.
Figure 6:
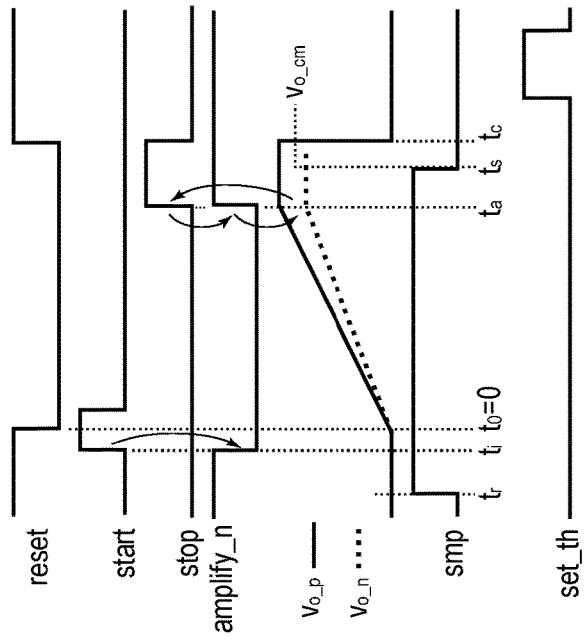
FIG. 6 is a timing diagram showing operation of the amplifier of FIG. 4.

FIG. 4 depicts a dynamic amplifier, used for example as the RA 14 of the pipeline SAR ADC 10 of FIG. 1. The outputs of the RA 14 are sampled by the second SAR stage 16, according to the timing diagram of FIG. 6. The RA 14 is powered up to a steady state with a constant biasing current $i_b$ flowing through the circuit to ground via the reset transistors. At time zero, $t_0$, the reset is released and the amplification begins. Voltages start to build up on the RA outputs, o_p and o_n, which are connected to the second SAR stage 16 top-plate nodes, sar_p and sar_n via the second SAR stage 16 sampling switches, controlled by the signal smp. When the RA output common mode (CM) $V_{o\_cm}$, which is the average of the differential output voltages $V_{o\_p}$ and $V_{o\_n}$, has reached a threshold voltage $v_{th\_cm}$, the CM detector generates a stop pulse at time $t_a$ that cuts off the current flowing in the RA 14, holding the output at its final level. This level is sampled by the second SAR stage 16 at time $t_s$, after which the RA cycle is completed by reset again at time $t_c$. Before the amplification starts, the SAR top-plates are reset by connecting to the RA 14 at time $t_r$.

Figure 5:
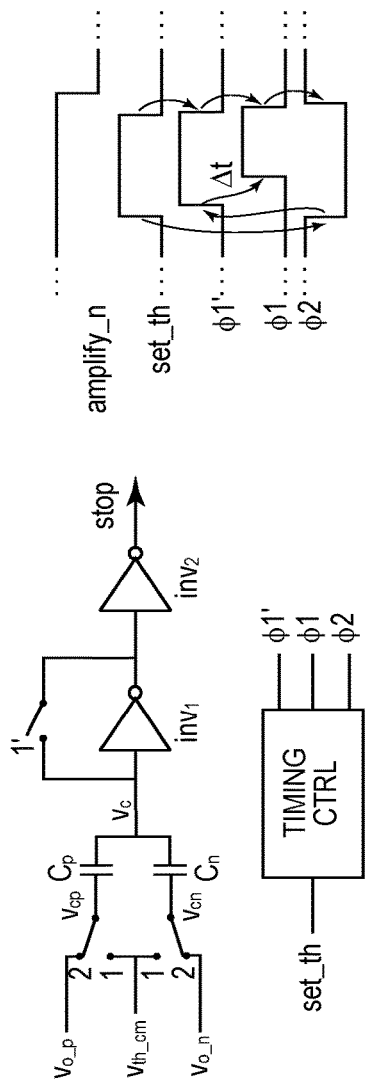
FIG. 5 show a block diagram, circuit schematic, and timing diagram of the common mode detector of FIG. 4.

FIG. 5 depicts a CM detector and timing diagram. The CM detector is used to generate the required stop pulse when the CM output voltage passes $v_{th\_cm}$. When the set_th signal to the CM detector is set high, the difference between $v_{th\_cm}$ and the threshold voltage of inv1 is presented to the two capacitors. At the transition from high to low of set_th, the voltage on the two capacitors is stored, and the capacitors are then connected to their respective RA outputs. At this point, the CM detector is actively comparing the RA output CM voltage to the sampled $v_{th\_cm}$. The CM detector is described in greater detail herein.

The gain of a residual amplifier $G_{ra}$, such as that depicted in FIG. 4, can be described as shown in equation 1, with differential input transistors operating either in saturation or weak inversion region:

$$G_{ra} = \begin{cases} \text{Saturation:} & \dfrac{2 \cdot v_{o\_cm}}{v_{gs} - v_{th}} \\ \text{Weak inversion:} & \dfrac{v_{o\_cm}}{\left(1 + \dfrac{C_{dep}}{C_{ox}}\right) \cdot \left(\dfrac{k \cdot T}{q}\right)} \end{cases} \quad (1)$$

The output CM voltage $v_{o\_cm}$ can be used to adjust the gain in both cases. For saturation, $v_{gs}-v_{th}$, is the MOS gate to source voltage minus the threshold voltage, called the overdrive voltage (vov), with relationship $$vov \propto \sqrt{\dfrac{i_b L}{W}}$$

It is clear that the bias current, $i_b$, and the MOS transistor dimensions L and W affect $G_{ra}$.

For the weak inversion region, $C_{dep}/C_{ox}$ is the ratio of the depletion and the oxide capacitances, which is process and operating point dependent, but may be substantially equal to 0.5. The variable k is Boltzmann constant, T is temperature, and q is the elementary charge. The quantity kT/q is typically 26 mV at room temperature. Only the output CM voltage is available as a mechanism to adjust the gain. The low supply voltages in modern processes favors the weak inversion region, since it allows a larger output swing before the differential stage enters the linear region.

Figure 7:
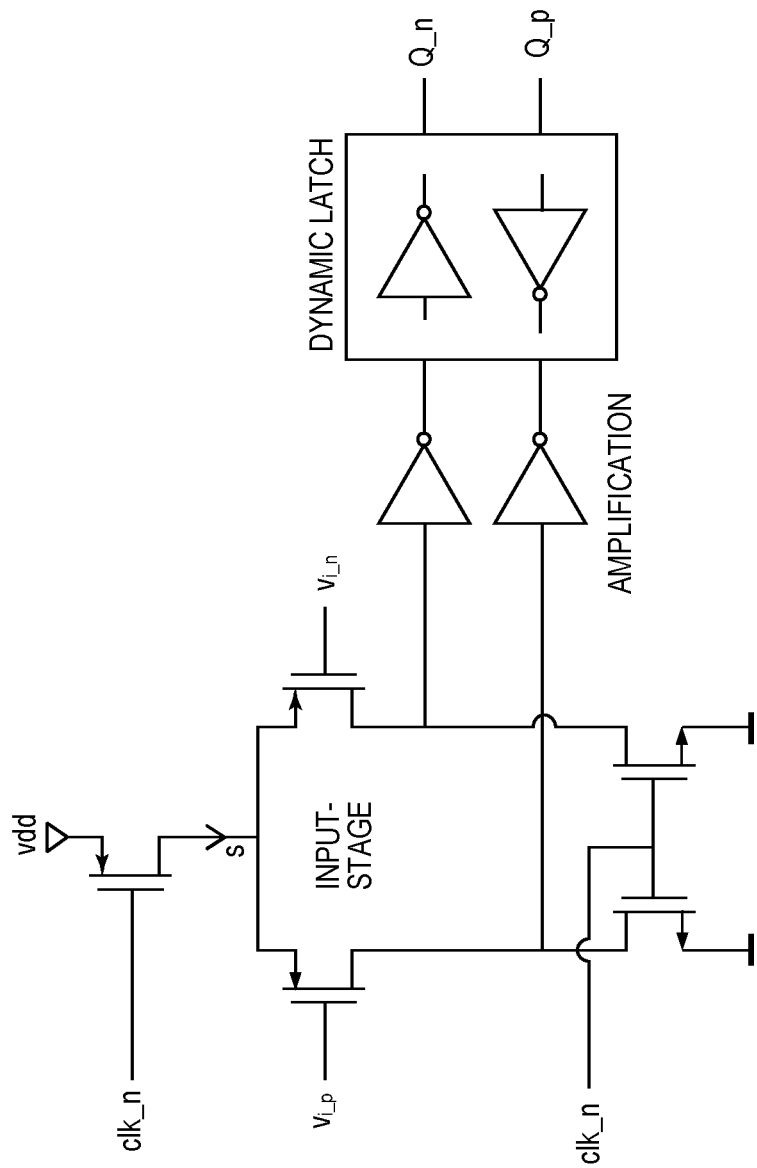
FIG. 7 is a schematic circuit diagram of a dynamic comparator.

FIG. 7 depicts a dynamic comparator, which may be used in lieu of a dynamic amplifier. The dynamic comparator does not suffer from gain uncertainties as dynamic amplifiers do, but it is desired that the comparison speed and noise is maintained in all PVT conditions. Furthermore, the offset needs to be stable over temperature, since digital correction and calibration are generally too slow to adapt to fast changes that may occur in pulsed operation, such as in time duplex wireless communication systems.

Figure 8:
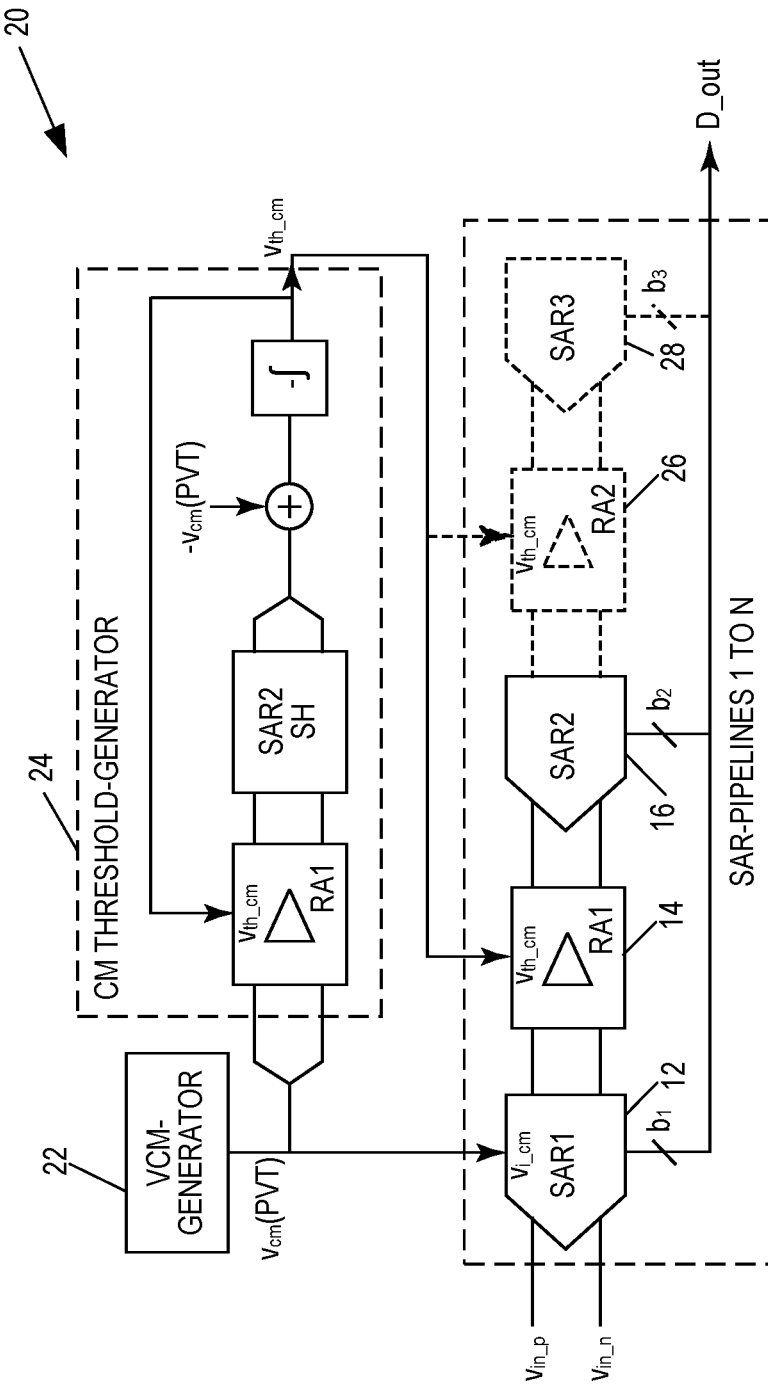
FIG. 8 is block diagram of a PVT-stabilized pipeline SAR ADC.

FIG. 8 depicts a PVT-stabilized pipeline SAR ADC structure 20, according to one embodiment. The basic ADC 20 comprises two SAR stages 12, 16 (SAR1 and SAR2), with a residual amplifier 14 (RA1) interposed between them, as shown in FIG. 1. For completeness, FIG. 8 depicts an optional successive SAR stage 28 (SAR3), receiving an amplified residual voltage from residual amplifier 26 (RA2). The pipeline SAR ADC structure 20 could include additional pipeline stages. The pipeline SAR ADC structure 20 depicted in FIG. 8 could comprise a complete, stand-alone SAR ADC. Alternatively, it may comprise one of two or more (up to N) parallel or interleaved pipeline SAR ADC structures 20. In either case, the pipeline SAR ADC 20 of FIG. 8 additionally includes a CM voltage generator 22 configured to generate a CM voltage $V_{CM}$(PVT), which depends on PVT characteristics of the pipeline SAR ADC 20. This voltage $V_{CM}$(PVT) biases the comparator inputs of at least the first SAR stage 12, and is additionally provided as an input to a CM threshold generator 24. The CM voltage generator 22 is common to all parallel or interleaved pipeline ADC structures.

The CM threshold generator 24 generates a threshold common mode voltage $V_{th\_cm}$ from $V_{CM}$(PVT). The threshold voltage $V_{th\_cm}$ is used by the RAs 14, 26 to regulate their CM output voltages to be substantially equal to $V_{CM}$(PVT), thus biasing successive SAR stages 16, 28 with the proper PVT-dependent voltage.

Figure 9:
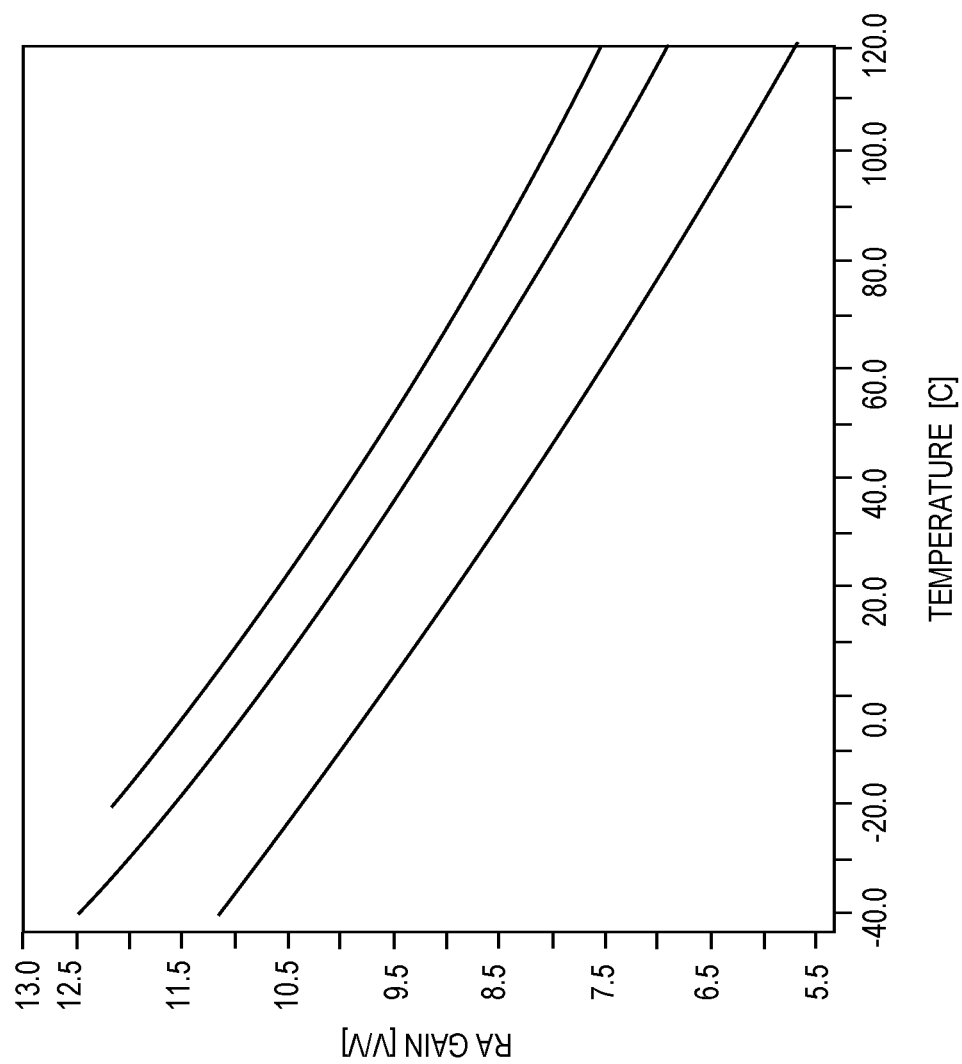
FIG. 9 is a graph showing the temperature-dependent gain of a non-PVT-stabilized dynamic residual amplifier.

FIG. 9 shows the temperature dependency of a simulated RA 14, 26, without any PVT compensation or gain stabilization, by plotting the RA gain against temperature for three process corners of a dynamic RA in 7 nm FinFET technology. The input is fixed, and the output CM voltages have no gain stabilization applied. The total gain varies from 5.6 to 12.5, with a temperature coefficient <0.38% per Kelvin.

Figure 10:
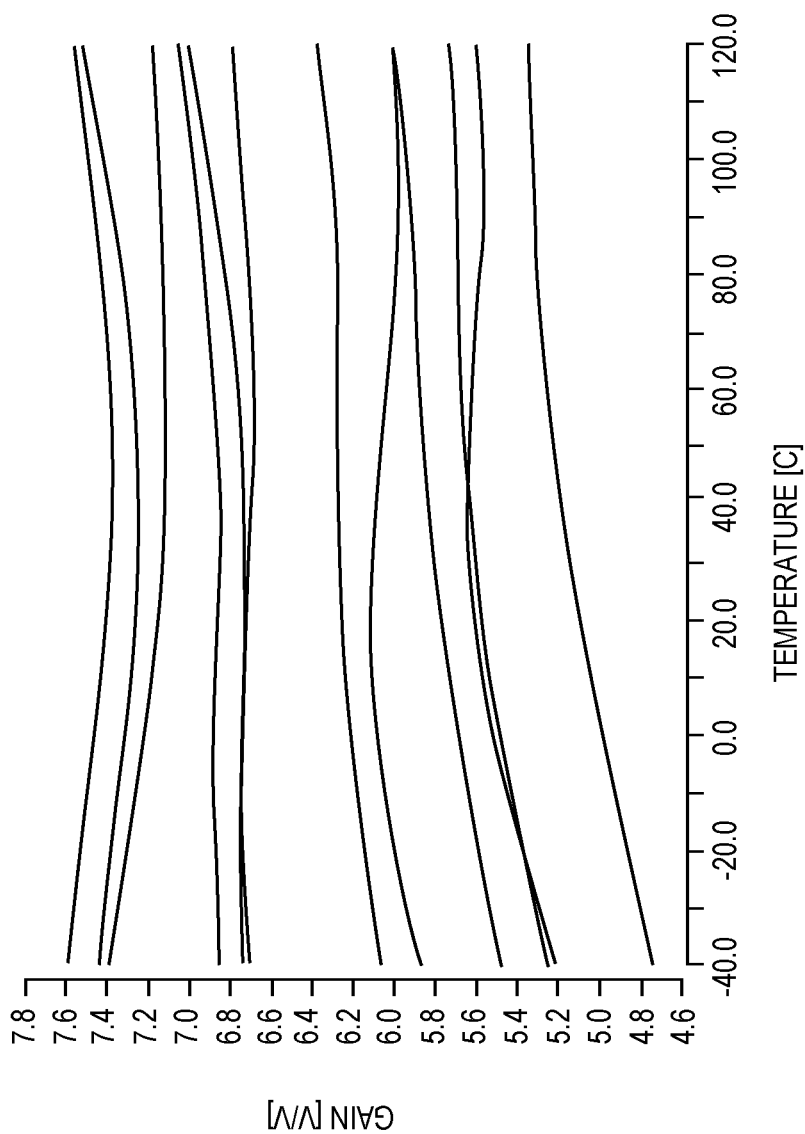
FIG. 10 is a graph showing the near temperature-independent gain of a PVT-stabilized dynamic residual amplifier.

FIG. 10 shows the dramatically reduced temperature dependency of a simulated RA 14, 26 according to embodiments of the present invention, again plotting RA gain against temperature, this time for twelve process and supply voltage corners, using the same technology. The comparator inputs are biased, and the RA CM outputs are regulated, by a PVT-dependent voltage according to embodiments described herein. The three process corners plotted in FIG. 9 are included in the twelve plots. Now the total gain varies from 4.7 to 7.6, but with a temperature coefficient of only <0.05% per Kelvin. The resulting smaller and near-static gain variation is relatively easy to compensate by digital adjustment of the ADC bit weights.

Regulating the RA 14 output common-mode voltage $V_{o\_cm}$ to the PVT-tracking voltage $V_{CM}$(PVT) thus at least partially counteracts the temperature dependent RA 14 gain, caused by the temperature dependent transconductance of the RA 14 input-stage. In some embodiments, the voltage regulation to the PVT-tracking voltage substantially cancels the temperature variation from a differential stage transconductance of the RA 14. In embodiments where the voltage regulation alone does not perfectly counteract the first-order temperature dependency of the RA 14 gain, the initial RA 14 output voltage at the start of the amplification phase can be trimmed to adjust the effective common-mode change at RA 14 amplification to match the needs for a perfect first-order temperature cancelation.

A requirement of embodiments disclosed herein is that the input stages of the comparator and the RA 14, 26 are of the same type—that is, either NMOS or PMOS—since their input nodes are common per pipeline stage. The embodiments discussed herein use PMOS input stages of comparators and RA, but NMOS input stages could be used as well by proper adaptation of the surrounding circuitry.

As depicted in FIG. 8, the PVT-dependent CM voltage $V_{cm}$(PVT) is generated in the CM generator 22 such that it counteracts the threshold voltage shifts and overdrive voltage of the input transistors in the RAs 14, 26 and comparators in SAR stages 12, 16, 28 of the pipeline SAR ADC 20. In this manner, the voltage on the node s in a residual amplifier, as depicted in FIG. 4, becomes stable either with reference to ground or with reference to $V_{dd}$, as preferred for a particular design.

FIG. 11A depicts a CM voltage generator 22 in which the PVT-dependent voltage $V_{cm}$(PVT) output is referenced to ground, and is independent of supply voltage variations. This provides the most stable RA gain, since no direct supply modulation of the gain is present. The ground-referred $V_{cm}$(PVT) is created from a bandgap voltage that is scaled by a factor α, such as by an amplifier or other appropriate circuitry, generating a voltage $v_s$. The voltage $v_s$ is the target voltage for the node s in the RA 14, 26 as mentioned above and should, for the lowest specified supply voltage, be set such that just sufficient headroom is available for the current source biasing in the RA 14, 26, and such that the comparator input stage receives sufficient current in active mode. The PVT-dependent voltage $V_{cm}$(PVT) is created as $v_s$ minus the voltage drop of the diode-connected transistor $M_s$ biased by the current $I_b$, where $M_s$ and $I_b$ match the differential pair input transistors and their bias currents, respectively.

FIG. 11B depicts a depicts a CM voltage generator 22 in which the PVT-dependent voltage $V_{cm}(PVT)$ output is referenced to the supply voltage $V_{dd}$. A resistor is connected to the supply voltage and biased with a current $I_b$. The resistor value is chosen to generate the desired voltage, given the bias current $I_b$. This resistor may be tunable as depicted, or may have a fixed value. This is a simple and robust solution that ensures enough headroom is available for the RA bias current source without the need for large headroom margins, which maximizes the RA output swing allowed by the supply. It will also provide the most stable speed of the comparators with respect to supply uncertainty since, when $v_s$ tracks $V_{dd}$, the on-current in the comparators is stabilized.

As depicted in FIG. 8, the PVT-dependent voltage $V_{cm}$ (PVT) is used by the first SAR stage 12 in the pipeline SAR ADC 20 such that it defines the input common-mode voltage $v_{i\_cm}$ to the comparator and the succeeding RA 14. One embodiment of the first SAR stage 12 is depicted in FIG. 2, where the $v_{i\_cm}$ input is connected to the PVT-dependent voltage $V_{cm}(PVT)$. This assumes that the CM voltages of the ADC reference, $v_{ref\_cm}$, and input voltage, $v_{in}$, are identical to each other.

Returning to FIG. 8, the PVT-dependent voltage $V_{cm}$ (PVT) is additionally an input to at least one CM threshold voltage generator 24, which in turn generates a threshold common mode voltage, $v_{th\_cm}$, which is used as a threshold by the CM detectors of the RAs 14, 26. The CM threshold generator adjusts the threshold CM voltage $v_{th\_cm}$ such that the SAR stage 16, 28 succeeding each RA 14, 26 samples a residual differential voltage with a CM that equals the PVT-dependent voltage $V_{cm}(PVT)$. As discussed above, in the case of multiple—e.g., parallel or interleaved—pipeline SAR ADC structures 20, each pipeline SAR ADC structure 20 may include a separate CM threshold voltage generator 24 generating a threshold CM voltage $v_{th\_cm}$ for the RAs 14, 26 of the respective pipeline SAR ADC structures 20.

FIG. 12 depicts a CM threshold voltage generator 24, according to one embodiment of the present invention. The CM threshold voltage generator 24 comprises a replica of the first RA 14 in the pipeline SAR ADC 20. The PVT-dependent voltage $V_{cm}(PVT)$ is applied to both inputs of the replica RA. Thus, the differential mode input to the replica RA is zero, but the common mode input is $V_{cm}(PVT)$. The replica RA outputs are then loaded by a replica of the second SAR stage 16 sampling circuitry, consisting of PDAC and NDAC instances identical to the ones in the second SAR stage 16, to replicate the load and sampling behavior that SAR stage 16. Since the only purpose of the sampling capacitors is to generate an accurate CM voltage, the top plates of the PDAC and NDAC are connected together, forming node $v_{rep\_cm}$. In some embodiments, for an even better matched load, the input capacitance of the missing comparator and succeeding RA 26 is represented by adding the capacitor $C_{add}$ that may be partially implemented by MOS gate capacitors for best tracking. Amplification and sampling using these replicas is carried out in the same manner, and with same timing, as in the first RA 14 and second SAR stage 16 in the pipeline SAR ADC 20.

Figure 13:
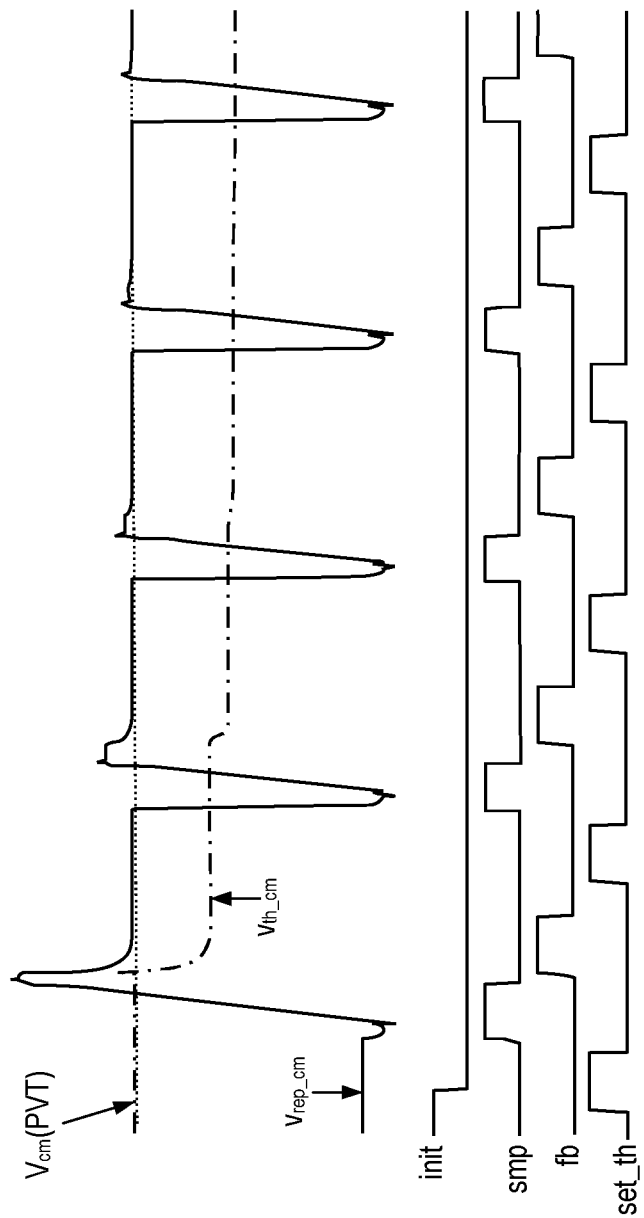
FIG. 13 is a timing diagram showing the operation of the threshold CM voltage generator of FIG. 12.

FIG. 13 is a timing diagram showing operation of the CM threshold voltage generator 24. The sampled voltage $v_{rep\_cm}$ is connected to the node $v_{sum}$ as the fb control signal goes high. Due to the feedback path of the capacitor $C_{int}$ around the amplifier $A_{int}$, the $v_{sum}$ node will regulate itself to track the $V_{cm}(PVT)$ voltage connected to the amplifier non-inverting input. Thereby, a charge equal to the difference between the $v_{rep\_cm}$ voltage and the $V_{cm}(PVT)$ voltage, times the total capacitance onto the top-plate node $v_{rep\_cm}$, will be transferred and stored onto $C_{int}$. The threshold CM voltage $v_{th\_cm}$ at the output of the amplifier is fed back to a CM detector in the replica RA, and will adjust the RA output CM voltage, and hence the $v_{rep\_cm}$ voltage, such that $v_{rep\_cm}$ converges towards $V_{cm}(PVT)$ after several amplification and sampling cycles.

To ensure a stable feedback loop, the value of capacitor $C_{int}$ should preferably be chosen significantly larger than the sum of the top-plate node capacitances. This lowers the loop gain, and achieves a low-pass filtering of noise and disturbances to the generated output threshold CM voltage $v_{th\_cm}$. At the least, the $C_{int}$ value should equal the sum of the top-plate node capacitances, since this will give the fastest regulation, as the CM error is then fully compensated for in a single step. A value less than half of the top-plate node capacitances will result in an unstable feedback loop.

FIG. 13 depicts a timing diagram of the control signals, and simulated results showing a settling of $V_{th\_cm}$. In this simulation, a loop-gain slightly lower than unity was chosen, to illustrate the settling within just a few cycles. FIG. 13 shows that the $V_{th\_cm}$ voltage adapts to a level that causes the $v_{rep\_cm}$ value to approach $V_{cm}(PVT)$ at the falling edge of the smp control signal pulses, when the $v_{rep\_cm}$ is sampled. The set_th control signal in the timing diagram is the control signal for the RA CM detector threshold update, as illustrated in FIG. 5. This is necessary to prepare the CM detector for detection of the CM level, as described further herein.

Figure 14:
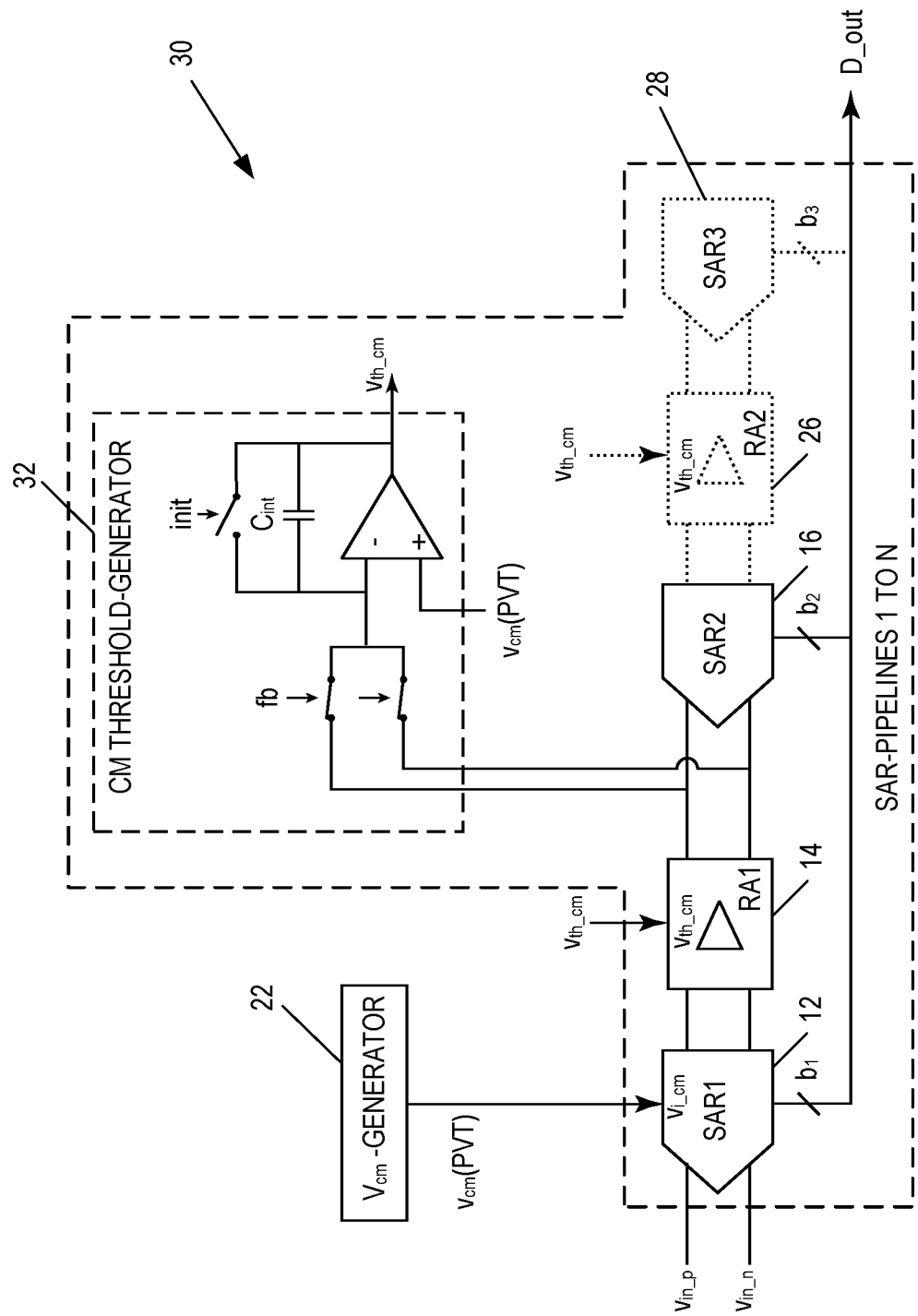
FIG. 14 is a block diagram of a PVT-stabilized pipeline SAR ADC with a threshold CM voltage generator according to another embodiment.

FIG. 14 depicts yet another embodiment of the inventive pipeline SAR ADC 30, comprising SAR stages 12, 16, and 28, with intervening RAs 14, 16. The CM voltage generator generates a PVT-dependent voltage $V_{cm}(PVT)$, referenced to either ground or the supply voltage, as shown in FIGS. 11A-B. In this embodiment, the pipeline SAR ADC 30 comprises one, or relatively few (N) parallel or interleaved, pipeline SAR ADCs. Accordingly, a simplified threshold voltage generator 32 is employed. The threshold voltage generator 32 includes the integrating amplifier with capacitive feedback, as described above with respect to the threshold voltage generator 24 of FIGS. 8 and 12. However, in the threshold voltage generator 32, the replica instances of an RA and sampling circuitry are avoided to reduce component count. The inverting input to the amplifier $A_{int}$ is in this case the CM output voltage of the actual RA 14. However, to avoid disturbing the bit-conversion operation of the second SAR stage 16, the CM voltage sampled in the second SAR stage 16 is not used for regulation of $v_{th\_cm}$. Rather, the CM voltage present on the RA 14 output after the second SAR stage 16 has finalized the sampling is used. The CM voltage in the second SAR stage 16 and at the output of the RA 14 should be equal, except for a small difference in response to charge injection from the sampling switch of the second SAR stage 16. The capacitor $C_{int}$ must in this case be smaller, sized with respect to the RA 14 output capacitance to achieve the desired regulation loop-response. The control signal timing diagram in FIG. 13 is valid also for this embodiment, except that the node voltage $v_{rep\_cm}$ should be replaced by the RA 14 outputs $v_{o\_p}$ and $v_{o\_n}$. To avoid loss of charge on Cant, the RA 14 must be reset to ground after the fb control signal has been deactivated. Because of its lower complexity and parts count, in the case of a parallel or interleaved SAR ADC, each of N pipeline SAR ADC structures 30 may include a separate CM threshold voltage generator 32, as indicated by the dashed line enclosing the CM voltage generator 32.

Referring back to FIG. 5, the structure and operation of the CM detector of RAs 14, 26 is described in greater detail. The CM detector stops the residual amplification when the measured CM output level exceeds a predefined threshold. The threshold of the circuit is refreshed when control signal set_th is high during the inactive phase of the RA 14, 26. The function of the Timing-ctrl block is to create non-overlapping control signals, φ1, φ1' and φ2, for the switches in the CM detector, which also minimize the disturbance on the threshold CM voltage $v_{th\_cm}$ during refresh, since this voltage may be shared by many RAs 14, 26. When the signal set_th goes high, the first signal to go low is φ2, which disconnects the RA 14, 26 outputs from the capacitors Cp and Cn. Next, φ1' goes high and closes the feedback part over the inverter inv1, which sets the voltage $v_c$ near the threshold of the inverter inv1. To avoid disturbance on the threshold input $v_{th\_cm}$ (which feeds numerous CM detectors), the signal φ1 is delayed until $v_c$ is well settled. The charge from the last refresh is stored on Cp and Cn, which then sets the voltages $v_{cp}$ and $v_{cn}$ to near $v_{th\_cm}$ before the capacitors connect to $v_{th\_cm}$. The settling of the refresh operation continues until the control signal set_th goes low, causing φ1' to go low, storing the charge on node $v_c$. After that, φ1 goes low and φ2 high in a non-overlapping sequence. After completion of this refresh operation, the CM detector is ready to be used for detection of the RA output CM voltage.

Figures 15, 16:
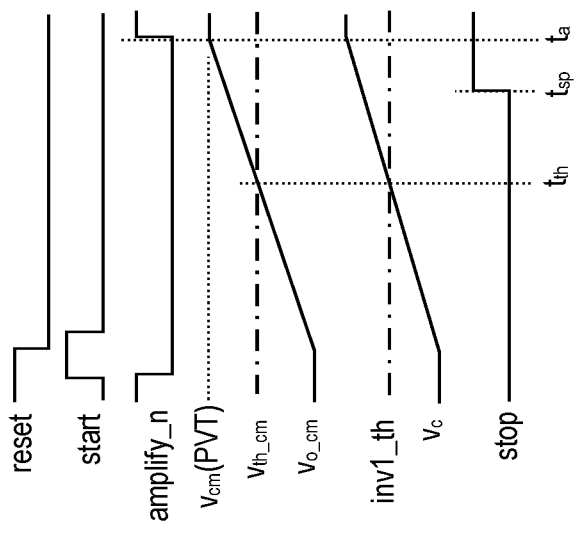
FIG. 15 is a timing diagram showing operation of the CM detector of FIG. 5.
FIG. 16 is a diagram showing temperature-dependent gain compensation concepts.

FIG. 15 shows the waveforms in the CM detectors, with delays in the logic to illustrate why a regulated threshold CM voltage $v_{th\_cm}$ is needed instead of using the PVT-dependent voltage $V_{cm}(PVT)$ directly. The refreshing of the threshold, as described above, is done prior to amplification. During amplification, the RA output CM voltage $v_{o\_cm}$ increases and passes $v_{th\_cm}$ at the same time (at $t_{th}$) as the $v_c$ voltage passes the $inv_1$ threshold. This will trigger the stop signal after inverter delays at time tsp, and finally the amplify_n signal at time $t_a$, due to delay from the SR-latch shown in FIG. 4. The capacitive load of the amplify_n node can be relatively large, and so in practice, it requires a driver chain of inverters that is not shown here for simplicity, but which will add to the total delay. The CM threshold generator regulates the threshold CM voltage $v_{th\_cm}$ to compensate for these delays and ensure that the residual amplification stops at $t_a$ when the RA output CM voltage $v_{o\_cm}$ equals $V_{cm}(PVT)$.

For the RA gain to be stable over temperature, it is important to be able to cancel the inherent decrease in gain caused by an increase in temperature of a dynamic amplifier as shown in FIG. 4, operating to a constant output CM. The gain of such an amplifier is as described previously, given by equation 1 for saturation and sub-threshold operation where short-channel effects are neglected. Tuning the RA output CM to the PVT-dependent voltage $V_{cm}(PVT)$, which optimizes the RA 14, 26 and comparator input stage operation, will counteract the Negative Temperature Coefficient (NTC) of the native RA 14, 26 to some extent. However, to be able to optimally cancel the NTC of the native RA 14, 26 with the Positive Temperature Coefficient (PTC) of the $V_{cm}(PVT)$, a trimming mechanism is required. This mechanism is described with reference to FIG. 16.

On the first row, the dynamic amplifier gain has been separated into a left factor for the native RA gain dependency, and a right factor for the effective output CM voltage, $v_{o\_cm\_eff}$, that is charged onto the output load capacitors. The $v_{o\_cm\_eff}$ equals the PVT-dependent voltage $V_{cm}(PVT)$ with an adjustable delta voltage $v_{o\_\Delta}$ added to it. The adjustable delta voltage $v_{o\_\Delta}$ is now the mechanism that can be adjusted such that the slope (illustrated in the second row) and the PTC (third row) of the right factor just compensate the slope or NTC of the left factor. The resulting gain will then become independent of temperature, at least at the temperature for which it was optimized. According to the simulated results shown in FIG. 10, the temperature range with low temperature coefficient of the gain is not limited to a certain temperature, but covers the entire temperature range normally specified for circuit operation. In FIG. 16, an operation in weak inversion is assumed for the left factor but the same reasoning is valid for the saturation region as well.

Figure 17:
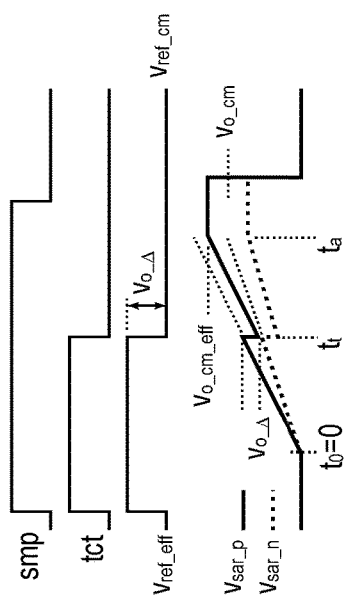
FIG. 17 is a timing diagram showing the operation of temperature-dependent gain compensation.

FIG. 17 illustrates by a timing diagram an example of how and when such an adjustable delta voltage $v_{o\_\Delta}$ can be added to the CM output voltage $V_{CM}(PVT)$ to yield an effective CM output voltage $v_{o\_cm\_eff}$ for a RA 14, 26 in a pipeline SAR ADC 20, 30. When the SAR stage 16, 28 that succeeds the RA 14, 26 has completed its conversion, the control signal smp is enabled and the SAR stage 16, 28 starts to reset. At that time, the effective voltage $V_{ref\_eff}$ at the bottom plate of the SAR capacitors is set to deviate from its normal voltage level $v_{ref\_cm}$ by the adjustable delta voltage $v_{o\_\Delta}$. The voltage $V_{ref\_eff}$ is the average of the voltages on bottom plates, weighted by their respective capacitor values. At time $t_0$, the amplification starts and when the RA 14, 26 is somewhere in its amplification phase, at time $t_t$, the voltage $V_{ref\_eff}$ is set back to the normal $v_{ref\_cm}$ level. The RA 14, 26 will terminate its amplification when its output CM voltage reaches $V_{cm}(PVT)$, but the effective charged voltage difference by the RA 14, 26 is now $v_{o\_cm\_eff}=V_{CM}(PVT)+v_{o\_\Delta}$, which sets the desired conditions for the temperature coefficient of the gain. The absolute value of the temperature-stabilized gain will be affected by this trimming, but such minor gain deviations can effectively be compensated by supplying appropriate voltage references to the succeeding SAR stages 16, 28.

Figure 18:
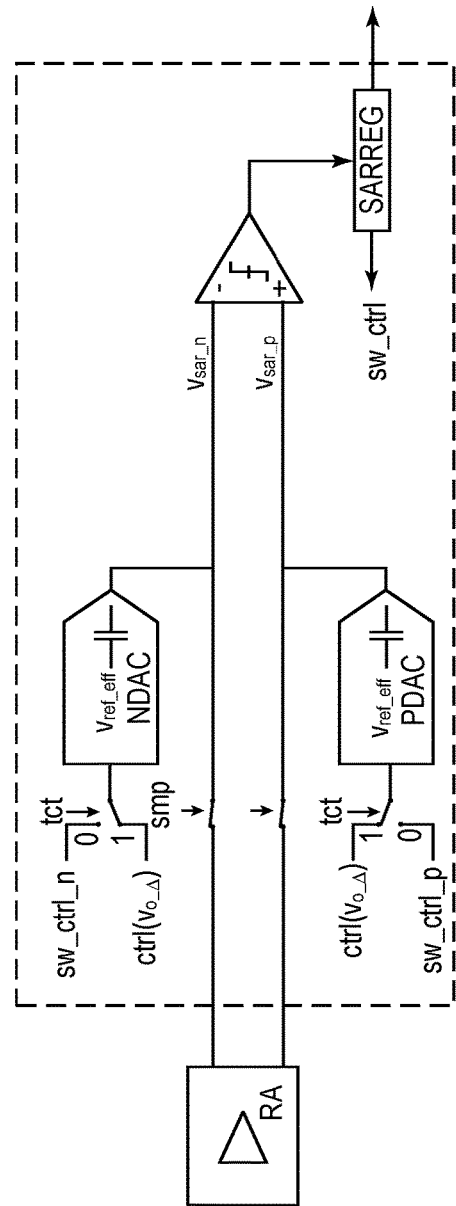
FIG. 18 is a block diagram of an implementation of temperature-dependent gain compensation.

FIG. 18 depicts one embodiment of compensation circuitry that implements the addition $v_{o\_cm\_eff}=V_{CM}(PVT)+v_{o\_\Delta}$, which does not require additional analog circuitry. A digital representation of the adjustable delta voltage $v_{o\_\Delta}$, denoted ctrl ($v_{o\_\Delta}$) in FIG. 18, is switched in to control the NDAC and PDAC when the tct control signal is high, so that $V_{ref\_eff}$ in NDAC and PDAC equals $v_{ref\_cm}+v_{o\_\Delta}$, as desired according to FIG. 17. After the control signal tct goes low, the normal SAR register control words, sw_ctrl_n and sw_ctrl_p, which are output by a register holding resolved bits of the DAC input voltage, control the NDAC and PDAC, respectively. This means that $v_{ref\_eff}$ in NDAC and PDAC will be set to $v_{ref\_cm}$ during the reminder of the RA 14, 26 amplification. The digital value ctrl ($v_{o\_\Delta}$) is chosen to give the closest approximation to the desired deviation from $v_{ref\_cm}$ (that is, the desired adjustable delta voltage $v_{o\_\Delta}$) that is allowed by the resolution of the DACs.

In another embodiment, the analog voltage $v_{ref\_cm}$ supplied to the NDAC and PDAC is directly switched between two levels: $v_{ref\_cm}$ and $v_{ref\_cm}+v_{o\_\Delta}$. This embodiment, however, requires extra switches on the analog references, which add parasitic resistance that slows down the DAC settling.

In yet another embodiment, the RA 14, 26 is reset to an adjustable delta voltage $v_{o\_\Delta}$ above ground, which from the amplification starts. However, this requires an extra analog reference for this purpose, and only gives a unipolar trimming since a voltage lower than ground cannot be used. Optionally, this analog reference may be created in the RA in FIG. 4 by placing a resistor in series between the reset switches and ground, and using the RA bias current ($i_b$) to create a voltage drop that serves as the voltage reference. That bias current will flow through the reset switches to ground when amplify_n has switched low, but before the reset switches are turned off.

In the embodiments described above, as depicted in FIG. 17, the insertion of $v_{o\_\Delta}$ is a a quick event that instantly changes the RA output by $v_{o\_\Delta}$. In still another embodiment, described with reference to FIGS. 19 and 20, this insertion is evenly distributed over the entire amplification time, by adding or subtracting identical currents to the RA 14, 26 positive and negative outputs during the time of RA amplification. The adjustable delta voltage $v_{o\_\Delta}$ then equals the product of the current and the amplification time, divided by the total capacitive load per RA output. These currents do not pass the RA 14, 16 differential stage, but should optimally be terminated by the amplify_n signal. For simplicity and ease of explanation, this termination is omitted in FIG. 19, which depicts the $v_{o\_\Delta}$ currents being added to the RA outputs.

Figure 19:
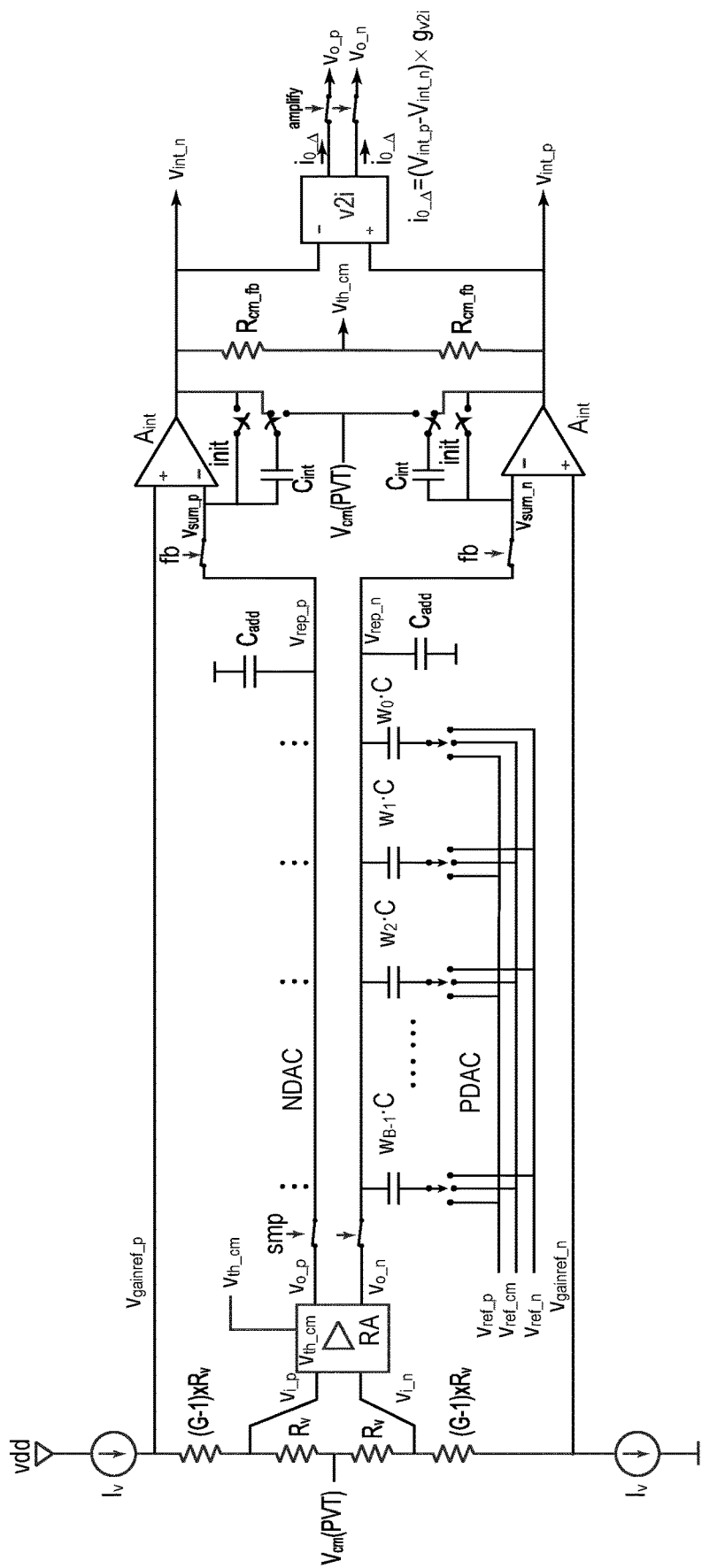
FIG. 19 is a schematic diagram of a combined common mode voltage and gain stabilization circuit.

The adjustable delta voltage $v_{o\_\Delta}$ not only alters the gain temperature coefficient but also directly influences the gain of the RA 14, 26. A constant and predetermined gain is thus achieved by adding or subtracting the right amount of bypass current. This gain is substantially independent of all PVT variations, given that the gain is within the $v_{o\_\Delta}$ trim range of the RA 14, 26 over the PVT variations. FIG. 19 depicts an example of such a regulation circuit, which is capable of both regulating the common-mode voltage level to $V_{CM}(PVT)$ and regulating the gain of the RA 14, 26 to a predetermined value. This circuit is an extension of the common-mode regulation circuit in FIG. 12.

Rather than a replica RA receiving $V_{CM}(PVT)$ at both inputs (and hence as a common-mode voltage), as in the circuit of FIG. 12, in the circuit of FIG. 19 the input to the replica RA is the differential voltage $v_{i\_p}-v_{i\_n}$. This is generated by the voltage drop over two resistors of value $R_v$ that are biased with two currents of magnitude $I_v$, respectively. The midpoint of the two resistors $R_v$ is tied to $V_{CM}(PVT)$, which sets the common-mode voltage to the replica RA input. Two other voltages, $V_{gainref\_p}$ and $V_{gainref\_n}$, are created by the same currents, but over a total of 2×G×$R_v$ of resistance. Accordingly, their differential voltage becomes G times larger than the differential input of the replica RA. G should be set to the target gain of an RA 14, 26, which then becomes the reference for a regulation loop. With this implementation, the target gain is solely defined by the ratio of resistors, which is inherently independent of PVT.

The differential input to the replica RA is amplified and sampled onto the replica SARDAC top plates with voltages $v_{rep\_p}$ and $v_{rep\_n}$. Following the same principle as described for the circuit in FIG. 12, these voltages are compared to their reference voltages, $V_{gainref\_p}$ and $V_{gainref\_n}$, respectively. When the fb signal goes high, charges are transferred into the integrators comprising the two amplifiers $A_{int}$ and the two capacitors $C_{int}$. These charges are equal to the respective voltage differences, times the total capacitance on a SARDAC top plate. The charge transfers update the integrator outputs in such a way that they can be used to regulate the associated RAs 14, 26 to approach the target common-mode and gain level.

The common-mode voltage of the output of the integrators is generated by the two resistors $R_{cm\_fb}$, and corresponds to the accumulated common-mode error of the RA output, which defines the $V_{th\_cm}$ voltage that regulates the RA output common mode as described for the circuit of FIG. 12. Similarly, the integrators differential voltage, $v_{int\_p}-v_{int\_n}$, is a measure of the accumulated gain error that can be used to regulate $v_{o\_\Delta}$ and thereby the RA gain. The adjustable delta voltage $v_{o\_\Delta}$ is applied to the RAs 14, 26 by creating two currents to each regulated RA 14, 26, as well as the replica RA, where the currents are proportional to the differential voltage of the integrators. This accomplished by a voltage-to-current converter, v2i, per RA with a transconductance, $g_{v2i}$, to both current outputs. These two currents are connected to the RA outputs during the amplification time, which regulates the amount of $v_{o\_\Delta}$ in such a way that the RA gain will equal G when the regulation loop has settled. The init control is only activated at startup to set $v_{int\_p}$ and $v_{int\_n}$ equal to $v_{cm}(PVT)$. This is a reasonable starting condition, but it does not affect the final state.

Figure 20:
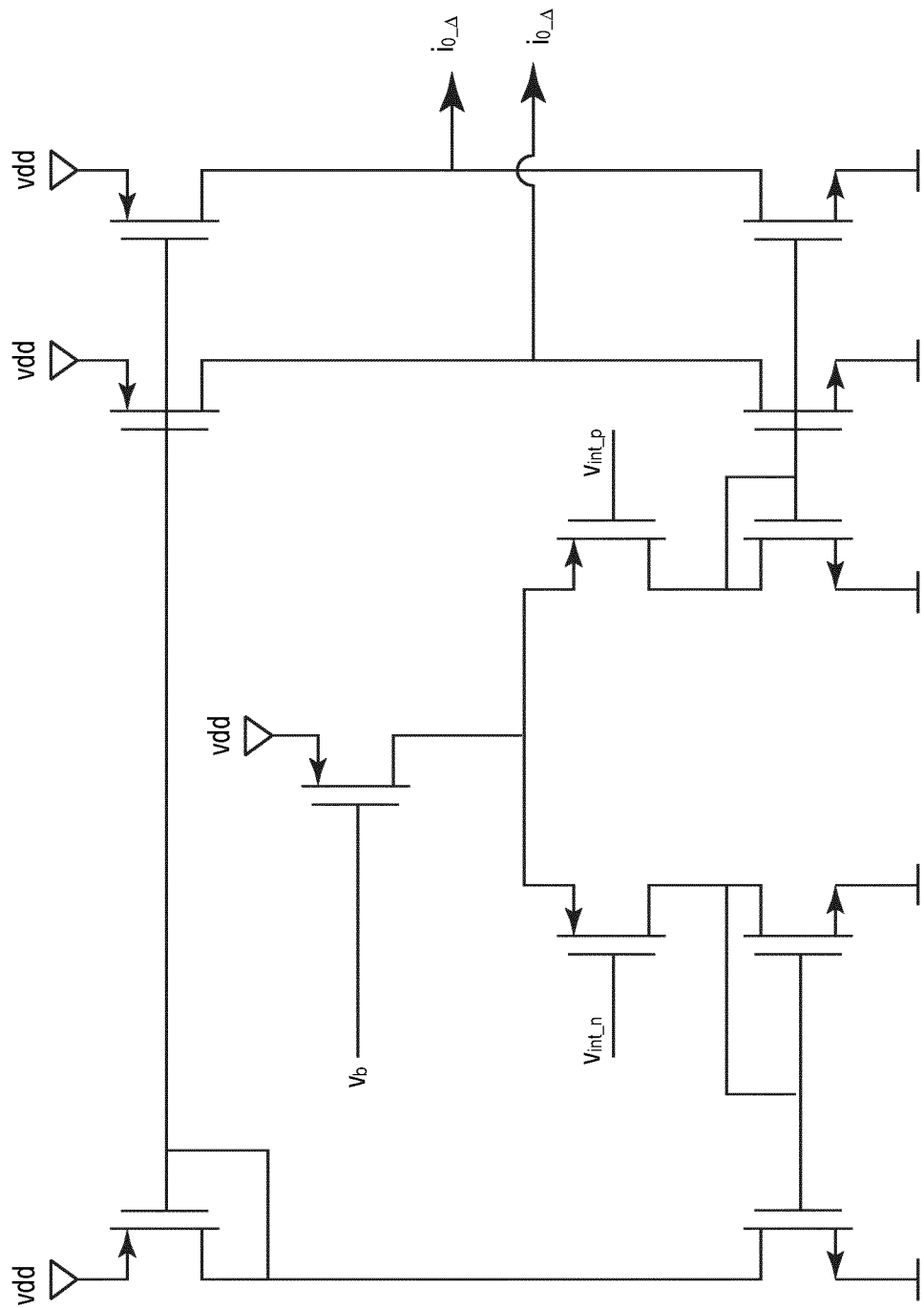
FIG. 20 is a schematic diagram of one embodiment of the voltage to current circuit of FIG. 19.

FIG. 20 depicts an implementation of the v2i circuit. One v2i circuit is required per RA 14, 26. To reduce unwanted parasitic capacitance, each v2i circuit should be placed in proximity to its associated RA 14, 26. In contrast, the voltages $v_{int\_p}$ and $v_{int\_n}$ are distributed over the pipeline SAR ADC.

The regulated RA gain stability is primarily limited by the regulation circuit non-idealities, since the gain reference is well defined. Accordingly, this regulation approach may outperform the other methods described herein, at the cost of a more complex regulation circuit and the additional v2i circuits.

The time spent for amplification is governed by the time it takes to integrate the RA output current on the load capacitor to a desired output CM voltage ($v_{o\_cm\_eff}$).

$$t_a = \frac{C_{load} \cdot v_{o\_cm\_eff}}{i_b/2}$$

The discussion above described how the NTC is counteracted by increasing $v_{o\_cm\_eff}$. This makes the RA gain more stable, but the larger $v_{o\_cm\_eff}$ also increases the amplification time. For that reason, it is desired to increase the bias current with temperature, using a Proportional To Absolute Temperature (PTAT) bias current for the RA input stage.

Figure 21:
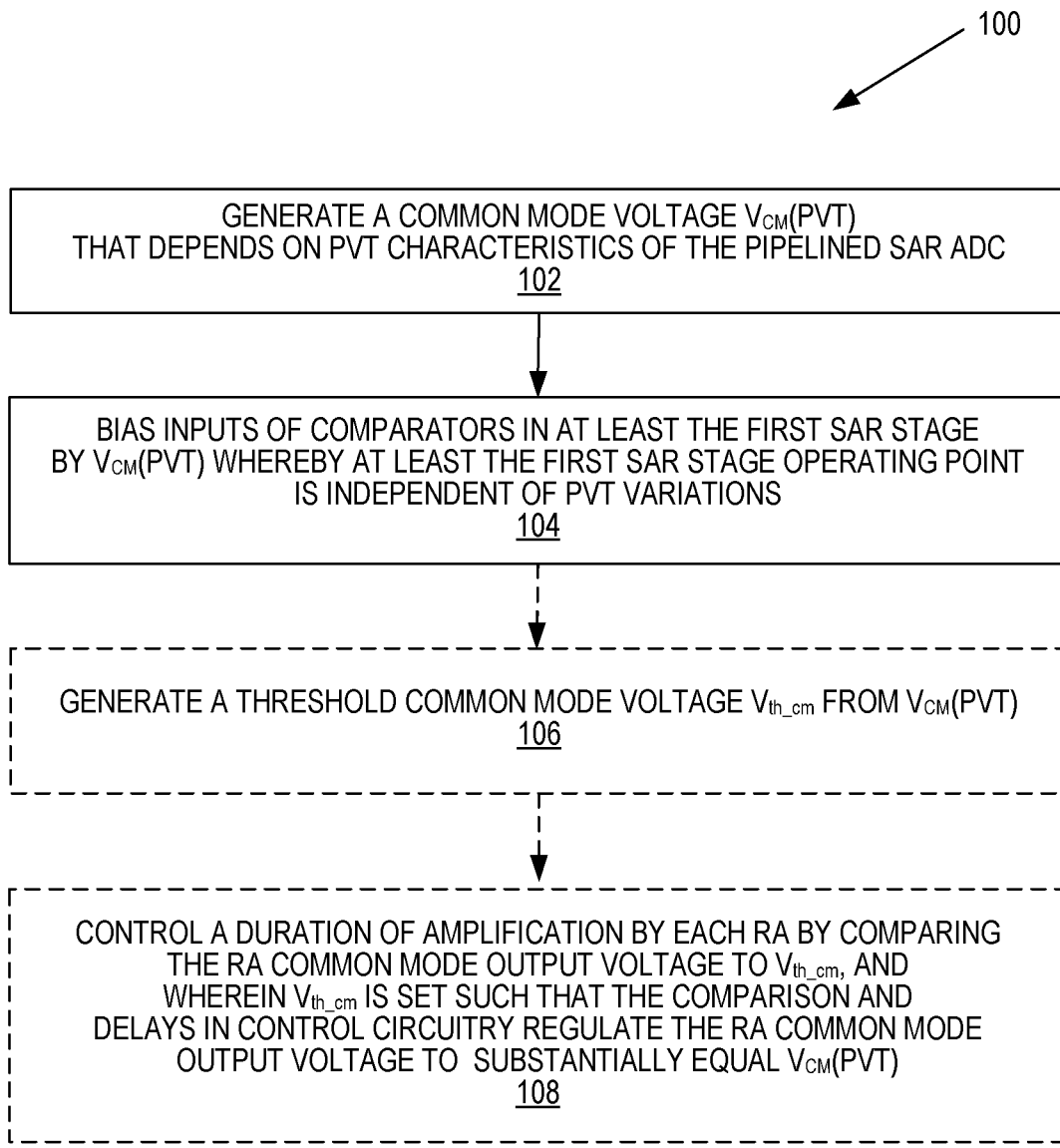
FIG. 21 is a flow diagram of a method of operating a PVT-stabilized pipeline SAR ADC.

FIG. 21 shows the steps of a method 100 of operating a pipeline SAR ADC 20, 30. The pipeline SAR ADC 20, 30 includes at least two SAR stages 12, 16, 28 and a RA 14, 26 between each two SAR stages 12, 16, 28. A CM voltage $V_{CM}(PVT)$ that depends on PVT characteristics of the pipeline SAR ADC 20, 30 is generated (block 102). Inputs of comparators in at least the first SAR stage 12 are biased by $V_{CM}(PVT)$ (block 104). This biasing makes at least the first SAR stage 12 operating point independent of PVT variations. Optionally, as indicated by dashed lines, a threshold common mode voltage $V_{th\_cm}$ is generated from $V_{CM}(PVT)$ (block 106). A duration of amplification by each RA 14, 28 is controlled by comparing the RA output common mode voltage to $V_{th\_cm}$ (block 108). The threshold common mode voltage $V_{th\_cm}$ is set such that the comparison and delays in control circuitry regulate the RA output common mode voltage to substantially equal $V_{CM}(PVT)$. This regulation makes the succeeding SAR stages 16, 28 operating point independent of PVT variations.

Fast, accurate, and PVT-stable ADCs 20, 30 are beneficially utilized in a wide variety of electronic devices. One particular application is in wireless communication devices and wireless network equipment, which must necessarily transition all communicated information between the digital domain in which it is processed and stored, and the analog domain of modulated RF carrier signals.

Figure 22:
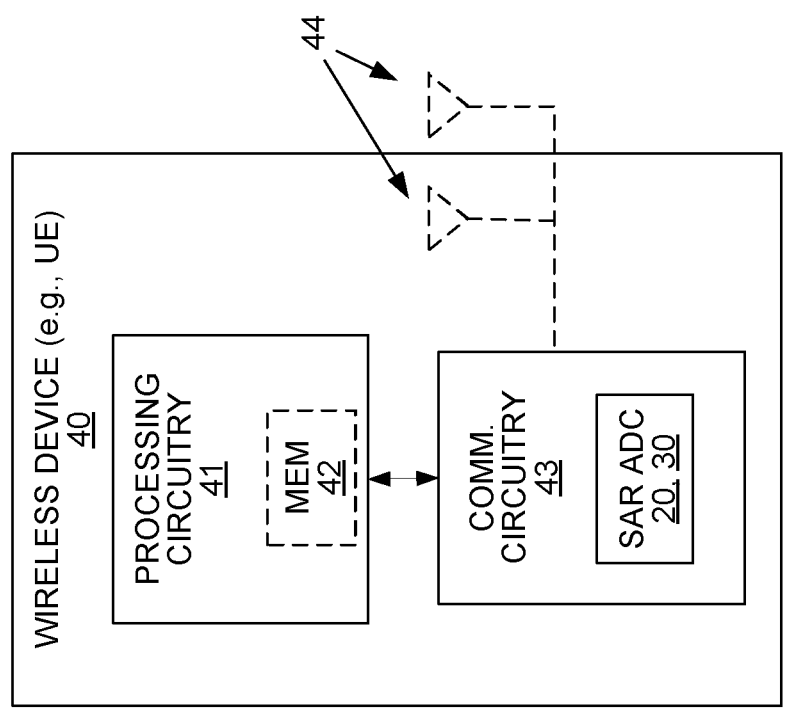
FIG. 22 is a block diagram of a wireless communication device.

FIG. 22 depicts a wireless device 40 operative in a wireless communication network, such a 3GPP LTE or NR network; a wireless LAN, such as Wi-Fi; an ad hoc wireless network, such as Bluetooth; or the like. A wireless device 40 is any type device capable of communicating with a network node, access point, and/or other wireless device using radio signals. A wireless device 40 may therefore refer to a machine-to-machine (M2M) device, a machine-type communications (MTC) device, a Narrowband Internet of Things (NB IoT) device, etc. The wireless device 40 may also be a User Equipment (UE), such as a cellular telephone or "smartphone." A wireless device 40 may also be referred to as a radio device, a radio communication device, a radio network device, a wireless terminal, or simply a terminal—unless the context indicates otherwise, the use of any of these terms is intended to include device-to-device UEs or devices, machine-type devices, or devices capable of machine-to-machine communication, sensors equipped with a radio network device, wireless-enabled table computers, mobile terminals, smart phones, laptop-embedded equipped (LEE), laptop-mounted equipment (LME), USB dongles, wireless customer-premises equipment (CPE), etc. In the discussion herein, the terms machine-to-machine (M2M) device, machine-type communication (MTC) device, wireless sensor, and sensor may also be used. It should be understood that these devices may be UEs, but may be configured to transmit and/or receive data without direct human interaction.

In some embodiments, the wireless device 40 includes a user interface (display, touchscreen, keyboard or keypad, microphone, speaker, and the like); in other embodiments, such as in many M2M, MTC, or NB IoT scenarios, the wireless device 40 may include only a minimal, or no, user interface. The wireless device 40 also includes processing circuitry 41; memory 42; and communication circuitry 43. According to embodiments of the present invention, the communication circuitry 43 includes one or more PVT-stabilized SAR ADCs 20, 30, as described herein. The communication circuitry 43 connects to one or more antennas 44, to effect wireless communication across an air interface to one or more radio network nodes, access points, and/or other wireless devices. As indicated by the dashed lines, the antenna(s) 44 may protrude externally from the wireless device 40, or the antenna(s) 44 may be internal. In various embodiments, the wireless device 40 may include a sophisticated user interface, and may additionally include features such as one or more cameras, an accelerometer, satellite navigation signal receiver circuitry, a vibrating motor, and the like (not depicted in FIG. 20).

Figure 23:
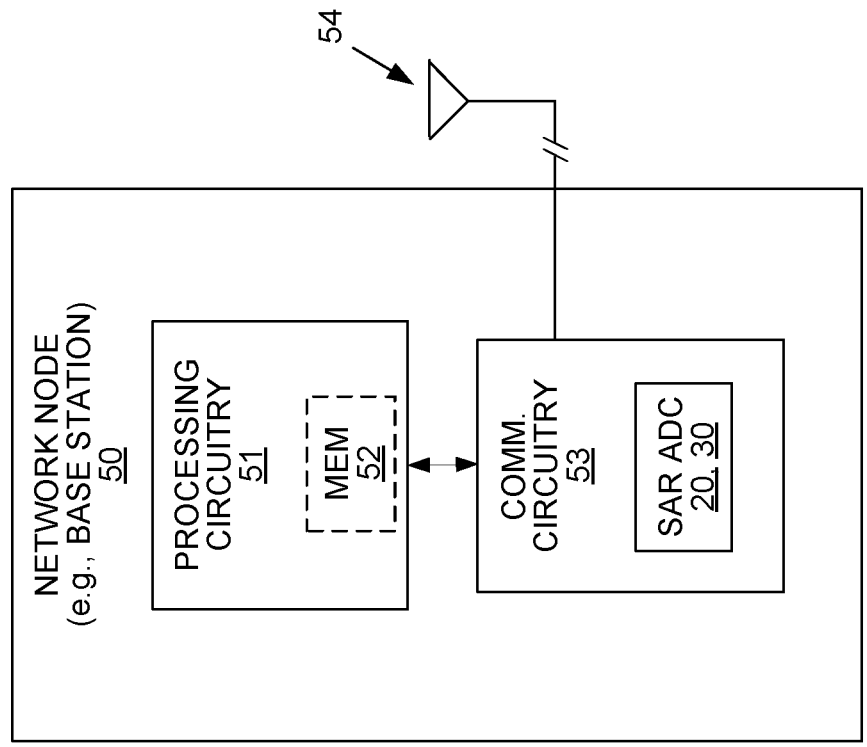
FIG. 23 is a block diagram of a wireless communication network node.

FIG. 23 illustrates a network node 50 as implemented in accordance with one or more embodiments. The network node 50 may comprise a base station or an access point of a wireless communication network. As shown, the network node 50 includes processing circuitry 51, memory 52, and communication circuitry 53. According to embodiments of the present invention, the communication circuitry 53 includes one or more PVT-stabilized SAR ADCs 20, as described herein. The communication circuitry 53 is configured to transmit and/or receive information to and/or from one or more wireless devices 40, or other network nodes. The communication circuitry 53 is operatively connected to one or more antennas 54. As indicated by the broken connection, the antenna(s) 54 may be located remotely, such as on a tower or building. Although the memory 52 is depicted as being internal to the processing circuitry 51, such as for example a cache memory or register file, those of skill in the art understand that memory 52 may also be external to the processing circuitry 51. Those of skill in the art additionally understand that virtualization techniques allow some functions nominally executed by the processing circuitry 51 to actually be executed by other hardware, perhaps remotely located (e.g., in the so-called "cloud").

In all embodiments, the processing circuitry 41, 51 may comprise any sequential state machine operative to execute machine instructions stored as machine-readable computer programs in memory 42, 52, such as one or more hardware-implemented state machines (e.g., in discrete logic, FPGA, ASIC, etc.); programmable logic together with appropriate firmware; one or more stored-program, general-purpose processors, such as a microprocessor or Digital Signal Processor (DSP), or any combination of the above.

In all embodiments, the memory 42, 52 may comprise any non-transitory machine-readable media known in the art or that may be developed, including but not limited to magnetic media (e.g., floppy disc, hard disc drive, etc.), optical media (e.g., CD-ROM, DVD-ROM, etc.), solid state media (e.g., SRAM, DRAM, DDRAM, ROM, PROM, EPROM, Flash memory, solid state disc, etc.), or the like.

In all embodiments, the communication circuitry 43, 53 may comprise one or more transceivers used to communicate with one or more other transceivers via a Radio Access Network (RAN) according to one or more communication protocols known in the art or that may be developed, such as IEEE 802.xx, CDMA, WCDMA, GSM, LTE, UTRAN, WiMax, NB-IoT, Bluetooth, or the like. The communication circuitry 43, 53 implements transmitter and receiver functionality appropriate to the RAN links (e.g., frequency allocations and the like).

Those skilled in the art will also appreciate that embodiments described herein further include corresponding computer programs. A computer program comprises instructions which, when executed on at least one processor of an apparatus, cause the apparatus to carry out any of the respective processing described above. A computer program in this regard may comprise one or more code modules corresponding to the means or units described above.

Embodiments further include a carrier containing such a computer program. This carrier may comprise one of an electronic signal, optical signal, radio signal, or computer readable storage medium.

In this regard, embodiments herein also include a computer program product stored on a non-transitory computer readable (storage or recording) medium and comprising instructions that, when executed by a processor or Digital Control circuit, cause the apparatus to perform as described above.

Embodiments of the present invention present numerous advantages over the prior art. PVT-stabilization of SAR ADCs 20, 30 improves stability of the gain and offset of residual amplifiers, and offset in comparators. This improved stability avoids or reduces performance degradation in pipeline SAR ADCs 20, 30 in the presence of, e.g., rapid on-chip temperature changes which digital correction cannot track and compensate fast enough. Moreover, improved stability reduces the amount of redundancy needed, which can be used to increase the pipeline SAR ADC 20, 30 resolution, or enable lowering the number of bit-conversions in the pipeline SAR ADC 20, 30, which saves area and power. A well-defined operation point also requires lower voltage margins for transistor saturation in the RAs 14, 28, which increases the headroom for a linear output swing. This in turn may benefit the pipeline SAR ADC 20, 30 linearity or the partitioning of bits between SAR stages 12, 16, 28.

Generally, all terms used herein are to be interpreted according to their ordinary meaning in the relevant technical field, unless a different meaning is clearly given and/or is implied from the context in which it is used. All references to a/an/the element, apparatus, component, means, step, etc.

are to be interpreted openly as referring to at least one instance of the element, apparatus, component, means, step, etc., unless explicitly stated otherwise. The steps of any methods disclosed herein do not have to be performed in the exact order disclosed, unless a step is explicitly described as following or preceding another step and/or where it is implicit that a step must follow or precede another step. Any feature of any of the embodiments disclosed herein may be applied to any other embodiment, wherever appropriate. Likewise, any advantage of any of the embodiments may apply to any other embodiments, and vice versa. Other objectives, features and advantages of the enclosed embodiments will be apparent from the description.

The term unit may have conventional meaning in the field of electronics, electrical devices and/or electronic devices and may include, for example, electrical and/or electronic circuitry, devices, modules, processors, memories, logic solid state and/or discrete devices, computer programs or instructions for carrying out respective tasks, procedures, computations, outputs, and/or displaying functions, and so on, as such as those that are described herein. As used herein, the term "configured to" means set up, organized, adapted, or arranged to operate in a particular way; the term is synonymous with "designed to." As used herein, the term "substantially" means nearly or essentially, but not necessarily completely; the term encompasses and accounts for mechanical or component value tolerances, measurement error, random variation, and similar sources of imprecision.

Some of the embodiments contemplated herein are described more fully with reference to the accompanying drawings. Other embodiments, however, are contained within the scope of the subject matter disclosed herein. The disclosed subject matter should not be construed as limited to only the embodiments set forth herein; rather, these embodiments are provided by way of example to convey the scope of the subject matter to those skilled in the art.

The present invention may, of course, be carried out in other ways than those specifically set forth herein without departing from essential characteristics of the invention. The present embodiments are to be considered in all respects as illustrative and not restrictive, and all changes coming within the meaning and equivalency range of the appended claims are intended to be embraced therein.

The invention claimed is:

1. A pipeline Successive Approximation Register (SAR) Analog to Digital Converter (ADC) including at least two SAR stages and a residual amplifier (RA) between each two SAR stages, the pipeline SAR ADC comprising:
a common mode (CM) voltage generator configured to generate a CM voltage, $V_{CM}(PVT)$, that depends on Process, Temperature, and Voltage (PVT) characteristics of the pipeline SAR ADC;
wherein inputs of comparators in at least the first SAR stage are biased by $V_{CM}(PVT)$, whereby at least the first SAR stage operating point is independent of PVT variations.

2. The pipeline SAR ADC of claim 1 wherein $V_{CM}(PVT)$ counteracts a PVT dependency of gate to source voltages of input transistors in the comparators to achieve stable biasing and an operating point that is independent of PVT variations.

3. The pipeline SAR ADC of claim 1, further characterized by:
a threshold voltage generator configured to generate a threshold common mode voltage, $V_{th\_cm}$, from $V_{CM}(PVT)$;
wherein each RA controls its duration of amplification by comparing its output common mode voltage to $V_{th\_cm}$, and wherein $V_{th\_cm}$ is set such that the comparison and delays in control circuitry regulate the RA output common mode voltage to substantially equal $V_{CM}(PVT)$.

4. The pipeline SAR ADC of claim 3 wherein the dependency on PVT of the threshold common mode voltage $V_{th\_cm}$ at least partially cancels temperature variation from a differential stage transconductance of the RA.

5. The pipeline SAR ADC of claim 1, wherein the CM voltage generator comprises:
a bandgap voltage generator configured to generate a bandgap voltage;
scaling circuitry configured to scale the bandgap voltage by a predetermined factor; and
a transistor biased by a current wherein the ratio of the transistor size to the bias current match a corresponding ratio for differential pair input transistors of an RA;
wherein the CM voltage output by the transistor is stable referenced to ground and is independent of variations in the supply voltage.

6. The pipeline SAR ADC of claim 1, wherein the CM voltage generator comprises:
a resistor connected to a supply voltage and biased with a current; and
a transistor biased by a current wherein the ratio of the transistor size to the bias current match a corresponding ratio for differential pair input transistors of an RA;
wherein the CM voltage output by the transistor is stable referenced to the supply voltage.

7. The pipeline SAR ADC of claim 3 wherein the threshold voltage generator comprises:
an integrating amplifier with capacitive feedback, wherein $V_{CM}(PVT)$ is connected to a non-inverting input of the amplifier,
the output common mode voltage of an RA is connected to an inverting input of the amplifier, and
the threshold common mode voltage $V_{th\_cm}$ output by the amplifier is connected to a common mode comparator of the RA;
whereby the amplifier generates the threshold common mode voltage $V_{th\_cm}$ such that the output common mode voltage of the RA is substantially equal to $V_{CM}(PVT)$.

8. The pipeline SAR ADC of claim 7 wherein the RA is an RA in the pipeline SAR ADC.

9. The pipeline SAR ADC of claim 8 wherein the threshold voltage generator samples the output common mode voltage of the RA in the pipeline SAR ADC after the succeeding SAR stage of the pipeline SAR ADC has finalized its sampling operation.

10. The pipeline SAR ADC of claim 7 wherein the RA is a replica of a first RA in the pipeline SAR ADC, wherein $V_{CM}(PVT)$ is connected to both inputs to the replica RA, and wherein the threshold voltage generator further comprises a replica of the second SAR stage sampling circuits connected to the replica RA outputs.

11. The pipeline SAR ADC of claim 10 further comprising a capacitance, substantially equal to the input capacitance of the comparator of the second SAR stage and the succeeding RA, connected to the replica RA outputs.

12. The pipeline SAR ADC of claim 1 further comprising compensation circuitry configured to add an adjustable delta voltage $(v_{o\_\Delta})$ to the RA output common mode voltage to yield an effective output CM voltage $(v_{o\_cm\_eff})$, wherein the adjustable delta voltage $(v_{o\_\Delta})$ is selected so as to counter a temperature-dependent gain change of the RA.

13. The pipeline SAR ADC of claim 12 wherein the compensation circuitry comprises, in each SAR stage, a switch configured to apply to each Digital to Analog Converter (DAC) of the SAR stage, one of a digital control word (sw_ctrl) output by a register holding resolved bits of the DAC input voltage, and a digital representation of the adjustable delta voltage ($v_{o\_\Delta}$).

14. The pipeline SAR ADC of claim 12 wherein the adjustable delta voltage ($v_{o\_\Delta}$) is negative, and wherein the compensation circuitry comprises a resistor and RA bias current.

15. The pipeline SAR ADC of claim 1 further comprising compensation circuitry configured to add an adjustable delta voltage ($v_{o\_\Delta}$) to the RA output common mode voltage, wherein the adjustable delta voltage ($v_{o\_\Delta}$) is selected so as to set the RA gain to a predetermined value.

16. The pipeline SAR ADC of claim 15 wherein the adjustable delta voltage ($v_{o\_\Delta}$) is added to the RA output common mode by adding or subtracting identical currents to or from the RA positive and negative outputs during the time of RA amplification.

17. The pipeline SAR ADC of claim 15 wherein the predetermined gain is set by a ratio of resistor values at the input to the compensation circuitry, and is hence independent of PVT variation.

18. The pipeline SAR ADC of claim 1, further comprising a Proportional To Absolute Temperature (PTAT) bias current generator configured to at least partially influence bias current in the RA to reduce variation in RA amplification time due to an output common-mode voltage following $V_{CM}(PVT)$.

19. The pipeline SAR ADC of claim 18 wherein the PTAT is configured to at least partially influence bias current in the RA to reduce variation in RA amplification time due to an effective output CM voltage ($v_{o\_cm\_eff}$) following the $V_{CM}(PVT)$ offset by an adjustable delta voltage ($v_{o\_\Delta}$).

20. A method of operating a Successive Approximation Register (SAR) Analog to Digital Converter (ADC) including at least two SAR stages and a residual amplifier (RA) between each two SAR stages, the method comprising:
generating a common mode (CM) voltage, $V_{CM}(PVT)$, that depends on Process, Temperature, and Voltage (PVT) characteristics of the pipeline SAR ADC; and
biasing inputs of comparators in at least the first SAR stage by $V_{CM}(PVT)$, whereby at least the first SAR stage operating point is independent of PVT variations.

21. The method of claim 20 wherein $V_{CM}(PVT)$ counteracts a PVT dependency of gate to source voltages of input transistors in the comparators to achieve stable biasing and an operating point that is independent of PVT variations.

22. The method of claim 20, further characterized by:
generating a threshold common mode voltage, $V_{th\_cm}$, from $V_{CM}(PVT)$; and
controlling a duration of amplification by each RA by comparing the RA output common mode voltage to $V_{th\_cm}$, and wherein $V_{th\_cm}$ is set such that the comparison and delays in control circuitry regulate the RA output common mode voltage to substantially equal $V_{CM}(PVT)$.

23. The method of claim 22 wherein the dependency on PVT of the threshold common mode voltage $V_{th\_cm}$ cancels temperature variation from a differential stage transconductance of the RA.

24. The method of claim 20, wherein generating the PVT-dependent CM voltage $V_{CM}(PVT)$ comprises:
generating a bandgap voltage;
scaling the bandgap voltage by a predetermined factor; and
passing the scaled bandgap voltage through a transistor biased by a current, wherein the transistor and bias current match differential pair input transistors of an RA, to generate the PVT-dependent CM voltage $V_{CM}(PVT)$;
wherein the PVT-dependent CM voltage $V_{CM}(PVT)$ is stable referenced to ground and is independent of variations in the supply voltage.

25. The method of claim 20, wherein generating the PVT-dependent CM voltage $V_{CM}(PVT)$ comprises:
biasing a resistor connected to a supply voltage by a bias current; and
passing the resistor voltage through a transistor biased by the bias current, wherein the transistor and bias current match differential pair input transistors of an RA, to generate the PVT-dependent CM voltage $V_{CM}(PVT)$;
wherein the PVT-dependent CM voltage $V_{CM}(PVT)$ is stable referenced to the supply voltage.

26. The method of claim 20 wherein generating the threshold common mode voltage $V_{th\_cm}$ from $V_{CM}(PVT)$ comprises:
comparing $V_{CM}(PVT)$ to the output common mode voltage of an RA;
generating the threshold common mode voltage $V_{th\_cm}$ in response to the comparison; and
supplying the threshold common mode voltage $V_{th\_cm}$ to a common mode comparator of the RA;
whereby the RA output common mode voltage is regulated to substantially equal $V_{CM}(PVT)$.

27. The method of claim 26 wherein the RA is an RA in the pipeline SAR ADC.

28. The method of claim 27 wherein comparing $V_{CM}(PVT)$ to the output common mode voltage of an RA comprises samples the output common mode voltage of the RA in the pipeline SAR ADC after the succeeding SAR stage of the pipeline SAR ADC has finalized its sampling operation.

29. The method of claim 26 wherein the RA is a replica of a first RA in the pipeline SAR ADC, wherein $V_{CM}(PVT)$ is connected to both inputs to the replica RA, and wherein the threshold voltage generator further comprises a replica of the second SAR stage sampling circuits connected to the replica RA outputs.

30. The method of claim 29 wherein a capacitance, substantially equal to the input capacitance of the comparator of the second SAR stage and the succeeding RA, is connected to the replica RA outputs.

31. The method of claim 20 further comprising adding an adjustable delta voltage ($v_{o\_\Delta}$) to the RA output common mode voltage to yield an effective output CM voltage ($v_{o\_cm\_eff}$), wherein the adjustable delta voltage ($v_{o\_\Delta}$) is selected so as to counter a temperature-dependent gain change of the RA.

32. The method of claim 20, further comprising at least partially influencing a bias current in the RA to reduce variation in RA amplification time due to an output common-mode voltage following $V_{CM}(PVT)$, by use of a Proportional To Absolute Temperature, PTAT, bias current generator.

33. A wireless device for a wireless communication network, characterized by:
processing circuitry; and
communication circuitry operatively connected to the processing circuitry, the communication circuitry comprising one or more pipeline Successive Approximation Register (SAR) Analog to Digital Converters (ADC) comprising:
  a common mode (CM) voltage generator configured to generate a CM voltage, $V_{CM}(PVT)$, that depends on Process, Temperature, and Voltage (PVT) characteristics of the pipeline SAR ADC;
  wherein inputs of comparators in at least the first SAR stage are biased by $V_{CM}(PVT)$, whereby at least the first SAR stage operating point is independent of PVT variations.

34. A network node for a wireless communication network, characterized by:
  processing circuitry; and
  communication circuitry operatively connected to the processing circuitry, the communication circuitry comprising one or more pipeline Successive Approximation Register (SAR) Analog to Digital Converters (ADC) comprising:
    a common mode (CM) voltage generator configured to generate a CM voltage, $V_{CM}(PVT)$, that depends on Process, Temperature, and Voltage (PVT) characteristics of the pipeline SAR ADC;
    wherein inputs of comparators in at least the first SAR stage are biased by $V_{CM}(PVT)$, whereby at least the first SAR stage operating point is independent of PVT variations.

* * * * *